(12) United States Patent
Kim et al.

(10) Patent No.: US 12,601,371 B2
(45) Date of Patent: Apr. 14, 2026

(54) HINGE STRUCTURE HAVING COUPLING STRUCTURE OF ARM PART AND ROTATION PART AND ELECTRONIC DEVICE INCLUDING THE SAME

(71) Applicant: SAMSUNG ELECTRONICS CO., LTD., Suwon-si (KR)

(72) Inventors: Hyungsoo Kim, Suwon-si (KR); Jaeho Kang, Suwon-si (KR); Jungjin Kim, Suwon-si (KR); Giyun Lee, Suwon-si (KR); Iksu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 395 days.

(21) Appl. No.: 18/321,245

(22) Filed: May 22, 2023

(65) Prior Publication Data

US 2023/0296129 A1 Sep. 21, 2023

Related U.S. Application Data

(63) Continuation of application No. PCT/KR2021/017879, filed on Nov. 30, 2021.

(30) Foreign Application Priority Data

Jan. 28, 2021 (KR) ........................ 10-2021-0012197

(51) Int. Cl.
| | |
|---|---|
| *H05K 5/00* | (2025.01) |
| *F16C 11/04* | (2006.01) |
| *H05K 5/02* | (2006.01) |

(52) U.S. Cl.
CPC ............ *F16C 11/04* (2013.01); *H05K 5/0226* (2013.01)

(58) Field of Classification Search
None
See application file for complete search history.

(56) References Cited

U.S. PATENT DOCUMENTS

| | | |
|---|---|---|
| 8,132,292 B2 | 3/2012 | Patterson |
| 9,094,490 B2 | 7/2015 | Sayama |
| | (Continued) | |

FOREIGN PATENT DOCUMENTS

| | | |
|---|---|---|
| CN | 210178745 U | 3/2020 |
| CN | 210423405 U | 4/2020 |
| | (Continued) | |

OTHER PUBLICATIONS

Office Action dated Jan. 16, 2025 in Korean Patent Application No. 10-2021-0012197 and English-language translation.

(Continued)

*Primary Examiner* — Anthony Q Edwards
*Assistant Examiner* — Rashen E Morrison
(74) *Attorney, Agent, or Firm* — Nixon & Vanderhye, P.C.

(57) ABSTRACT

An example hinge structure of an electronic device includes a first rotation part connected to a first housing and being rotatable about a first axis, a second rotation part connected to a second housing and being rotatable about a second axis in an opposite direction to that of the first rotation part, a first arm part connected to the first rotation part and being rotatable about a first rotary shaft, a second arm part connected to the second rotation part and being rotatable about a second rotary shaft in an opposite direction to that of the first arm part, a first fixing pin connecting the first rotation part and the first arm part, and a second fixing pin connecting the second rotation part and the second arm part. The first rotation part may include a first bracket body, and a first sliding part formed on one side of the first bracket (Continued)

body, and including a first slide hole, into which a portion of the first fixing pin is insertable, the first arm part may include a basic body, and a first connection part formed on one side of the first basic body, and the first connection part may include a first connection hole, into which a portion of the first fixing pin is insertable, and a first protrusion formed at a peripheral portion of the first connection hole such that at least a portion thereof is located in the first slide hole to contact the first sliding part.

20 Claims, 20 Drawing Sheets

(56)                    References Cited

U.S. PATENT DOCUMENTS

| | | | |
|---|---|---|---|
| 9,250,733 | B2 | 2/2016 | Lee et al. |
| 10,604,978 | B2 | 3/2020 | Wu |
| 10,761,573 | B2 | 9/2020 | Hsu |
| 10,761,574 | B1 | 9/2020 | Hsu et al. |
| 10,845,850 | B1 * | 11/2020 | Kang .................... G06F 1/1652 |
| 10,963,020 | B2 | 3/2021 | Kim et al. |
| 11,231,754 | B2 | 1/2022 | Kang et al. |
| 11,550,367 | B2 * | 1/2023 | Lin ....................... G06F 1/1681 |
| 2009/0199364 | A1 | 8/2009 | Patterson |
| 2013/0192140 | A1 | 8/2013 | Sayama |
| 2014/0185233 | A1 | 7/2014 | MacDonald et al. |
| 2015/0233162 | A1 | 8/2015 | Lee et al. |
| 2018/0283067 | A1 | 10/2018 | Wu |
| 2020/0103935 | A1 * | 4/2020 | Hsu ....................... G06F 1/1681 |
| 2020/0264674 | A1 | 8/2020 | Km et al. |
| 2020/0401193 | A1 | 12/2020 | Hsu et al. |
| 2021/0165466 | A1 * | 6/2021 | Kang .................... G06F 1/1616 |
| 2021/0365073 | A1 * | 11/2021 | Cha ........................ G06F 1/1652 |
| 2022/0086265 | A1 | 3/2022 | Shang |
| 2022/0113770 | A1 | 4/2022 | Kang et al. |

FOREIGN PATENT DOCUMENTS

| | | |
|---|---|---|
| CN | 211259337 U | 8/2020 |
| CN | 112178041 A | 1/2021 |
| CN | 112243053 A | 1/2021 |
| KR | 20150096827 A | 8/2015 |
| KR | 20190067400 A | 6/2019 |
| KR | 20200011100 A | 2/2020 |
| KR | 20200101238 A | 8/2020 |
| KR | 20200117773 A | 10/2020 |
| KR | 20200126524 A | 11/2020 |

OTHER PUBLICATIONS

Extended Search Report dated Apr. 15, 2024 in European Patent Application No. 21923408.5.
Written Decision on Registration dated Aug. 26, 2025 in Korean Patent Application No. 10-2021-0012197 and English-language translation.

* cited by examiner

HINGE STRUCTURE HAVING COUPLING STRUCTURE OF ARM PART AND ROTATION PART AND ELECTRONIC DEVICE INCLUDING THE SAME

CROSS-REFERENCE TO RELATED APPLICATIONS

This application is a continuation of International Patent Application No. PCT/KR2021/017879, designating the United States, filed Nov. 30, 2021, in the Korean Intellectual Property Receiving Office, and claiming priority to Korean Patent Application No. 10-2021-0012197, filed Jan. 28, 2021, in the Korean Intellectual Property Office. The contents of each of these applications are incorporated herein in their entireties.

BACKGROUND

Field

The disclosure relates to a hinge structure having an improved coupling structure of an arm part and a rotation part, and an electronic device including the same.

Description of Related Art

Portable electronic devices, such as smartphones, may provide various functions, such as voice communications, reproduction of videos, and internet searching, based on various kinds of applications. A user may desire to use the above-described various functions through a wider screen. However, as the screen becomes larger, portability may be degraded. Accordingly, foldable portable electronic devices that may enhance portability by using foldable structures have been developed.

According to the foldable electronic device, adjacent housings are connected to each other by a hinge structure, and the hinge structure may be rotated while supporting the housings while the housings are rotated at specific angles.

SUMMARY

According to a hinge structure of a foldable electronic device, while an arm part and a rotation part are rotated, a fixing pin that connects the arm part and the rotation part may cause friction with a peripheral structure, for example, at least one of the arm part or the rotation part. Accordingly, the fixing pin and the peripheral structure may be seamed due to friction, or dust may be generated due to the friction. Alternatively, the fixing pin and the peripheral structure may be worn due to collisions thereof.

Various example embodiments of the disclosure provide a hinge structure that may prevent (or reduce) movement of a fixing pin by making a connection relationship between an arm part and a rotation part firmer, and an electronic device including the same.

Various example embodiments provide a hinge structure that may restrain seaming and restrain generation of dust due to friction with a fixing pin that connects an arm part and a rotation part and a peripheral structure and improve wearing performance, by preventing (or reducing) movement of the fixing pin, and an electronic device including the same.

According to example various embodiments, a hinge structure of an electronic device (or a portable electronic device, a foldable communication device, a foldable electronic device, or a foldable electronic device having a communication function) may include a first rotation part connected to a first housing and being rotatable about a first axis, a second rotation part connected to a second housing and being rotatable about a second axis in an opposite direction to that of the first rotation part, a first arm part connected to the first rotation part and being rotatable about a first rotary shaft, a second arm part connected to the second rotation part and being rotatable about a second rotary shaft in an opposite direction to that of the first arm part, a first fixing pin connecting the first rotation part and the first arm part, and a second fixing pin connecting the second rotation part and the second arm part. The first rotation part may include a first bracket body, and a first sliding part formed on one side of the first bracket body, and include a first slide hole, into which a portion of the first fixing pin is inserted, the first arm part may include a first basic body, and a first connection part formed on one side of the first basic body, and the first connection part may include a first connection hole, into which a portion of the first fixing pin is inserted, and a first protrusion formed at a peripheral portion of the first connection hole such that at least a portion thereof is located in the first slide hole to contact the first sliding part.

According to various example embodiments, an electronic device may include a first housing, a second housing, at least one hinge structure connecting the first housing and the second housing, and a display, at least a portion of which is disposed on the first housing, the second housing, and the at least one hinge structure. The hinge structure may include a first rotation part connected to the first housing and being rotatable about a first axis, a second rotation part connected to the second housing and being rotatable about a second axis in an opposite direction to that of the first rotation part, a first arm part connected to the first rotation part and being rotatable about a first rotary shaft, a second arm part connected to the second rotation part and being rotatable about a second rotary shaft in an opposite direction to that of the first arm part, a first fixing pin connecting the first rotation part and the first arm part, and a second fixing pin connecting the second rotation part and the second arm part. The first rotation part may include a first bracket body, and a first sliding part formed on one side of the first bracket body, and including a first slide hole, into which a portion of the first fixing pin is inserted, the first arm part may include a first basic body, and a first connection part formed on one side of the first basic body, and the first connection part may include a first connection hole, into which a portion of the first fixing pin is inserted, and a first protrusion formed in a peripheral part of the first connection hole such that at least a portion thereof is located in the first slide hole to contact the first sliding part.

According to the hinge structure having an improved coupling structure between the arm part and the rotation part, and the electronic device including the same according to various embodiments, generation of friction between the fixing pin and the peripheral structure may be reduced by forming coupling of the arm part and the rotation part denser and thus preventing (or reducing) movement of the fixing pin.

Through this, according to various embodiments, seaming or generation of dust which may occur due to the movement of the fixing pin may be reduced and wearing performance may be improved.

Other various effects provided by the hinge structure and the electronic device including the same according to various embodiments may be mentioned according to the embodiments of the detailed description of the disclosure.

BRIEF DESCRIPTION OF THE DRAWINGS

The above and other aspects, features and advantages of certain embodiments of the present disclosure will be more apparent from the following detailed description taken in conjunction with the accompanying drawings, in which.

DETAILED DESCRIPTION

Figure 1:
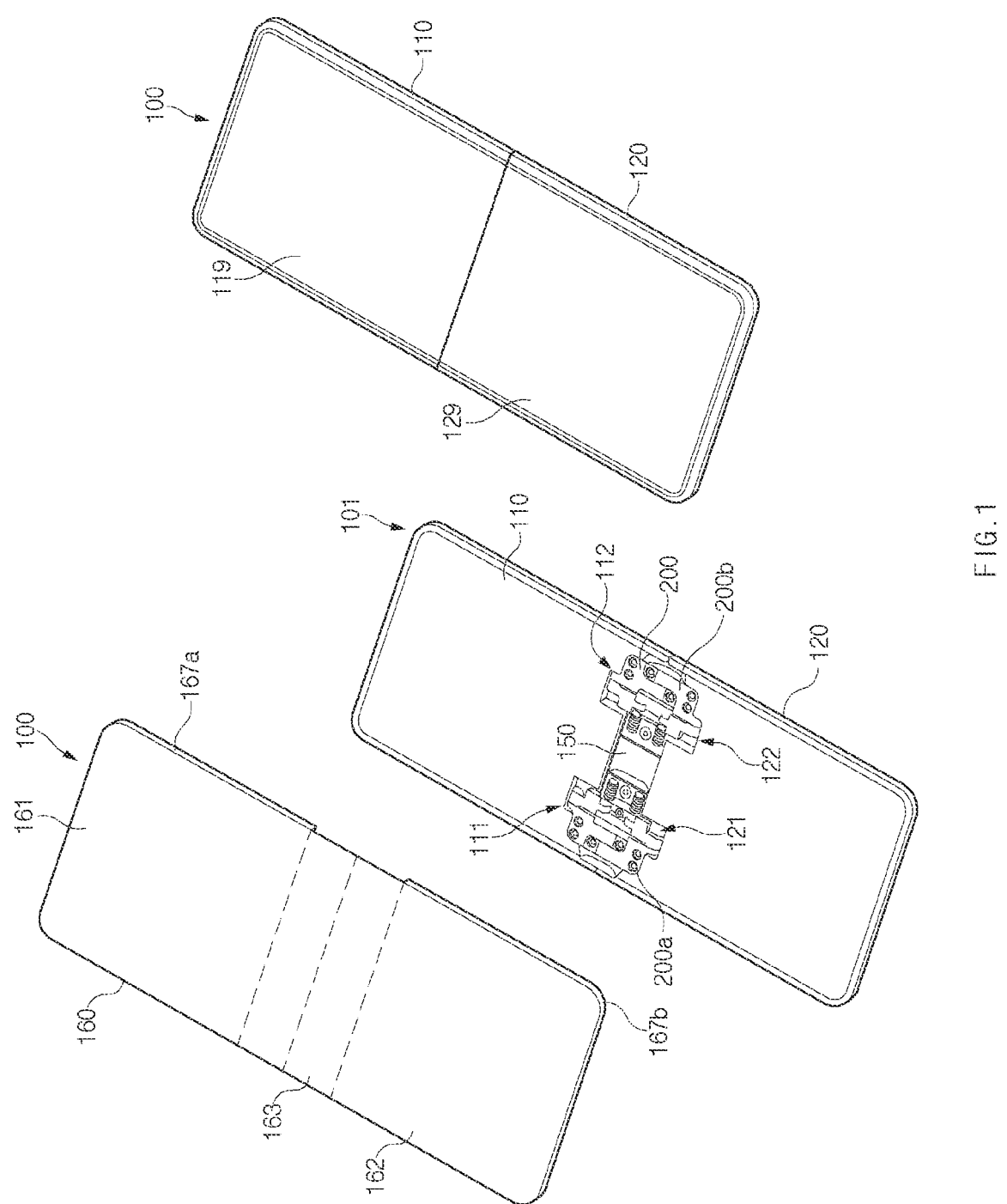
FIG. 1 is a perspective view of an unfolded state of an example electronic device according to various embodiments.

Hereinafter, various example embodiments of the disclosure will be described with reference to the accompanying drawings. Those of ordinary skill in the art will recognize that modifications, equivalents, and/or alternatives of the various example embodiments described herein can be made without departing from the scope and spirit of the disclosure. With regard to the description of drawings, similar components may be denoted by similar reference numerals.

In the disclosure disclosed herein, the expressions "have", "may have", "include" and "comprise", or "may include" and "may comprise" used herein indicate existence of corresponding features (e.g., components such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of (1) a case in which at least one A is included, (2) a case in which at least one B is included, and (3) a case in which both of at least one A and at least one B are included.

The terms such as "first", "second", and the like used herein may refer to various components of various embodiments of the disclosure, but do not limit the components. For example, a first user device and a second user device may represent different user devices irrespective of sequence or importance. For example, without departing the scope of the disclosure, a first component may be referred to as a second component, and similarly, a second component may be referred to as a first component.

It will be understood that when a component (e.g., a first component) is referred to as being "(operatively or communicatively) coupled with/to" or "connected to" another component (e.g., a second component), it can be directly coupled with/to or connected to the other component or an intervening component (e.g., a third component) may be present. In contrast, when a component (e.g., a first component) is referred to as being "directly coupled with/to" or "directly connected to" another component (e.g., a second component), it should be understood that there is no intervening component (e.g., a third component).

According to the situation, the expression "configured to" used herein may be used as, for example, the expression "suitable for", "having the capacity to", "designed to", "adapted to", "made to", or "capable of". The term "configured to (or set to)" may, for example, refer to not only "specifically designed to" in hardware. Instead, the expression "a device configured to" may refer to the device being "capable of" operating together with another device or other components. A CPU, for example, a "processor configured to perform A, B, and C" may refer, for example, to a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

Terms used in this specification are used to describe example embodiments of the disclosure and are not intended to limit the scope of the disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the disclosure. According to occasions, even a term defined in the disclosure cannot be construed to exclude the embodiments of the disclosure.

An electronic device according to various example embodiments of the disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, mobile medical devices, cameras, and wearable devices. According to various example embodiments of the disclosure, the wearable devices may include accessories (e.g., watches, rings, bracelets, ankle bracelets, glasses, contact lenses, or head-mounted devices (HMDs)), cloth-integrated types (e.g., electronic clothes), body-attached types (e.g., skin pads or tattoos), or implantable types (e.g., implantable circuits).

Hereinafter, electronic devices according to example embodiments of the disclosure will be described with reference to the accompanying drawings. The term "user" used herein may refer to a person who uses an electronic device or may refer to a device (e.g., an artificial electronic device) that uses an electronic device.

Figure 2:
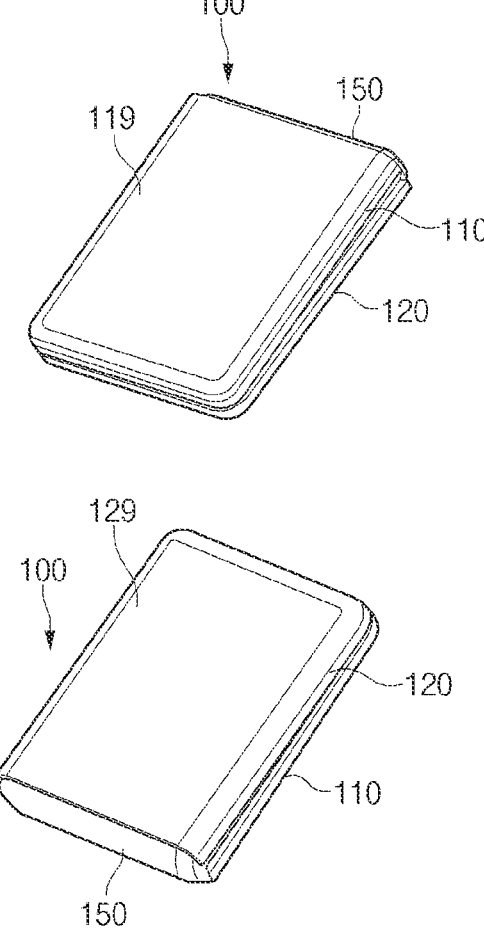
FIG. 2 is a perspective view of a folded state of an example electronic device according to various embodiments.

FIG. 1 is a perspective view of an unfolded state of an example electronic device according to various embodiments. FIG. 2 is a perspective view of a folded state of an example electronic device according to various embodiments.

Referring to FIGS. 1 and 2, an electronic device 100 (or a foldable electronic device) according to an embodiment may include housings including a first housing 110 and a second housing 120, a display 160 (e.g., a flexible display), and a hinge housing 150, in which a hinge structure 200 is disposed on an inside thereof. FIG. 1 is a perspective view of a flat state, an unfolding state, or a unfolded state of the electronic device 100, and FIG. 2 is a perspective view of the folded state or a folding state of the electronic device 100. Additionally or alternatively, the electronic device 100 may further include a first cover 119 that covers a rear surface of the first housing 110, and a second cover 129 that covers a rear surface of the second housing 120.

According to various embodiments, the first housing 110 may be disposed to be continuous to the second housing 120 (e.g., when a central portion 163 of the display 160 is unfolded or the housings are unfolded), or may be disposed to be parallel to the second housing 120, according to a disposition state thereof. Alternatively, when the central portion 163 of the display 160 is folded, one surface of the first housing 110 may be disposed to face one surface of the second housing 120.

At least a portion of the first housing 110, for example, may be formed of a metallic material, or at least a portion thereof may be formed of a nonmetallic material. For example, the first housing 110 may be formed of a material having a specific strength to support at least a portion of the display 160. An area (e.g., an upper portion 161 and a portion of the central portion 163 of the display 160) of the display 160 may be disposed at at least a portion of a front surface of the first housing 110. At least a portion of the first housing 110 may be bonded to the upper portion 161 of the display 160. Alternatively, at least a portion of a periphery of a front surface of the first housing 110 may be bonded to a periphery of the upper portion 161 of the display 160. Alternatively, one side of an upper portion of the front surface of the first housing 110 may be bonded to one side of the upper portion 161 of the display 160. In this regard, a first bonding layer 167a may be disposed at at least a portion between the first housing 110 and the upper portion 161 of the display 160. At least a portion on an inside of the first housing 110 may be provided to be hollow or may be provided to be hollow while being coupled to the first cover 119 whereby electronic elements (e.g., a printed circuit board, or elements, such as at least one processor, at least one memory, and a battery, which are mounted on the printed circuit board) may be disposed.

According to various embodiments, peripheral ends (e.g., peripheral ends of the remaining three sites, except for a periphery that faces the second housing 120) of the first housing 110, may protrude from a bottom surface of a central portion of the housing by a specific height to surround a periphery of at least one side of the display 160. Side walls, at least portions of which faces a periphery of the display 160, may be disposed at at least a portion of a peripheral end of the first housing 110. The side walls formed at the at least a portion of the periphery of the first housing 110 may be formed while having a specific height at peripheries of the remaining three sites, except for a periphery thereof, which faces the second housing 120. The peripheral portion of the first housing 110, which faces the second housing 120, may include a recessed portion, at least a portion of which has a specific curvature, such that a least a portion of the hinge housing 150 and at least a portion of the hinge structure 200, which is seated on the hinge housing 150, are disposed therein. For example, the first housing 110 may include a first stepped portion 111, on which at least a portion of a first hinge structure 200a is seated, and a second stepped portion 112, on which at least a portion of a second hinge structure 200b is seated, at the periphery portion that faces the second housing 120.

According to various embodiments, the second housing 120 may be disposed in parallel to the first housing 110, or may be disposed to face one surface (a surface, on which the display 160 is disposed) of the first housing 110, according to a disposition thereof. The second housing 120 may be formed of the same material as that of the first housing 110. The second housing 120 is disposed to be symmetrical to the first housing 110 leftwards and rightwards or upwards and downwards, and thus a front surface thereof may be disposed to support at least a portion (e.g., a lower portion 162 and an opposite side of the central portion 163 of the display 160) of the remaining one area of the display 160, except for the area disposed in the first housing 110. At least a portion of the second housing 120 may be bonded to the lower portion 162 of the display 160. Alternatively, a periphery of the front surface of the second housing 120 may be bonded to a periphery of the lower portion 162 of the display 160. Alternatively, one side of a lower portion of the front surface of the second housing 120 may be bonded to one side of the lower portion 162 of the display 160. In this regard, a second bonding layer 167b may be disposed at at least a portion between the second housing 120 and the lower portion 162 of the display 160. At least a portion of an inside of the second housing 120 may be hollow or may be hollow while being coupled to the second cover 129 similarly to the first housing 110, and thus electronic elements that are necessary for driving of the display 160 may be disposed therein.

According to various embodiments, peripheral ends (e.g., peripheral ends of the remaining three sites, except for a periphery that faces the first housing 110) of the second housing 120, may protrude from a bottom surface of the central portion of the second housing 120 by a specific height to surround a periphery of an opposite side of the display 160. Alternatively, similarly to the side walls formed in the first housing 120, side walls, at least a portion of which faces a periphery of the display 160, may be disposed at at least a portion of a peripheral end of the second housing 120. The side walls formed at the at least a portion of the periphery of the second housing 120 may be formed while having a specific height at peripheries of the remaining three sites, except for a periphery thereof, which faces the first housing 110.

The portion of the second housing 120, which faces the first housing 110, may include a recessed portion, at least a portion of which has a specific curvature, such that the hinge housing 150 and the hinge structure 200, at least a portion of which is seated on the hinge housing 150, are disposed therein. For example, the second housing 120 may include a third stepped portion 121, on which at least a portion of the first hinge structure 200a is seated, and a fourth stepped portion 122, on which at least a portion of the second hinge structure 200b is seated, at the periphery portion that faces the first housing 110.

According to various embodiments, the electronic device 100 may include at least one sensor disposed on one side of the first housing 110 or the second housing 120 and related to an operation of a specific function of the electronic device 100. The sensor, for example, may include at least one of a proximity sensor, an illumination sensor, an iris sensor, an image sensor (or a camera), or a fingerprint sensor.

According to various embodiments, the hinge housing 150 may be covered by one side of the first housing 110 or the second housing 120 (e.g., the unfolded state of the housings) or may be exposed to an outside (e.g., the folded state of the housings) according to the folded or unfolded state of the electronic device 100. For example, as in FIG. 1, when the first housing 110 and the second housing 120 are disposed parallel to each other, the hinge housing 150 may be covered by the first housing 110 and the second housing 120. As in FIG. 2, when one surface of the first housing 110 and one surface of the second housing 120 are disposed to face each other, the hinge housing 150 may be disposed such that at least a portion thereof is exposed to an outside at peripheries (e.g., peripheries, at which the first housing 110 and the second housing 120 face each other in the unfolded state) of the first housing 110 and the second housing 120.

According to various embodiments, at least a portion of the display 160 may be flexible. According to an embodiment, the display 160 may include the upper portion 161 or a first area disposed on the first housing 110, the lower portion 162 or a second area disposed on the second housing 120, and the central portion 163 or a central area, to which the first housing 110 and the second housing 120 are adjacent. According to various embodiments, the entire display 160 may be flexible. Alternatively, at least a portion of the central portion 163 of the display 160 may be flexible. The central portion 163 of the display 160 may be disposed such that the first housing 110 and the second housing 120 are prevented from being bonded to each other. For example, the central portion 163 of the display 160 may be disposed to be spaced apart from the front surfaces of the first housing 110 and the second housing 120 by a specific distance. The upper portion 161 of the display 160 may be bonded to at least a portion of the first housing 110, and the lower portion 162 of the display 160 may be bonded to at least a portion of the second housing 120. In this regard, the first bonding layer 167a may be disposed in at least a partial area between the display 160 and the first housing 110, and the second bonding layer 167b may be disposed in at least a partial area between the display 160 and the second housing 120. The first bonding layer 167a and the second bonding layer 167b may be disposed only at peripheries of the first housing 110 and the second housing 120.

According to various embodiments, the hinge structure 200 may include the first hinge structure 200a and the second hinge structure 200b. The illustrated drawing illustrates a state in which the first hinge structure 200a and the second hinge structure 200a are disposed in the hinge housing 150, but the disclosure is not limited thereto, and three or more hinge structures may be disposed on the hinge housing 150 if necessary or desirable.

The first hinge structure 200a may be disposed on one side (e.g., a left side with respect to a longitudinal center line of the electronic device of the illustrated drawing) of the hinge housing 150. The first hinge structure 200a may be coupled to one side (e.g., a left side with respect to the longitudinal center line of the electronic device) of the first housing 110 and one side (e.g., the left side with respect to the longitudinal central line of the electronic device) of the second housing 120, and may be rotated within a specific range with respect to a transverse axis of the hinge housing 150. The first hinge structure 200a may be disposed to be symmetrical to the second hinge structure 200b with respect to a central portion of the hinge housing 150.

The second hinge structure 200b may be disposed on an opposite side (e.g., a right side with respect to the longitudinal central line of the electronic device of the illustrated drawing) of the hinge housing 150. The second hinge structure 200b may be coupled to an opposite side (e.g., a right side with respect to the longitudinal center line of the electronic device) of the first housing 110 and an opposite side (e.g., the right side with respect to the longitudinal center line of the electronic device) of the second housing 120, and may be rotated within a specific range with respect to the transverse axis of the hinge housing 150. The second hinge structure 200b may be disposed to be symmetrical to the first hinge structure 200a with respect to the central portion of the hinge housing 150. The second hinge structure 200b may include the same structure and configuration as that of the first hinge structure 200a, and a disposition location thereof may be different.

Figure 3:
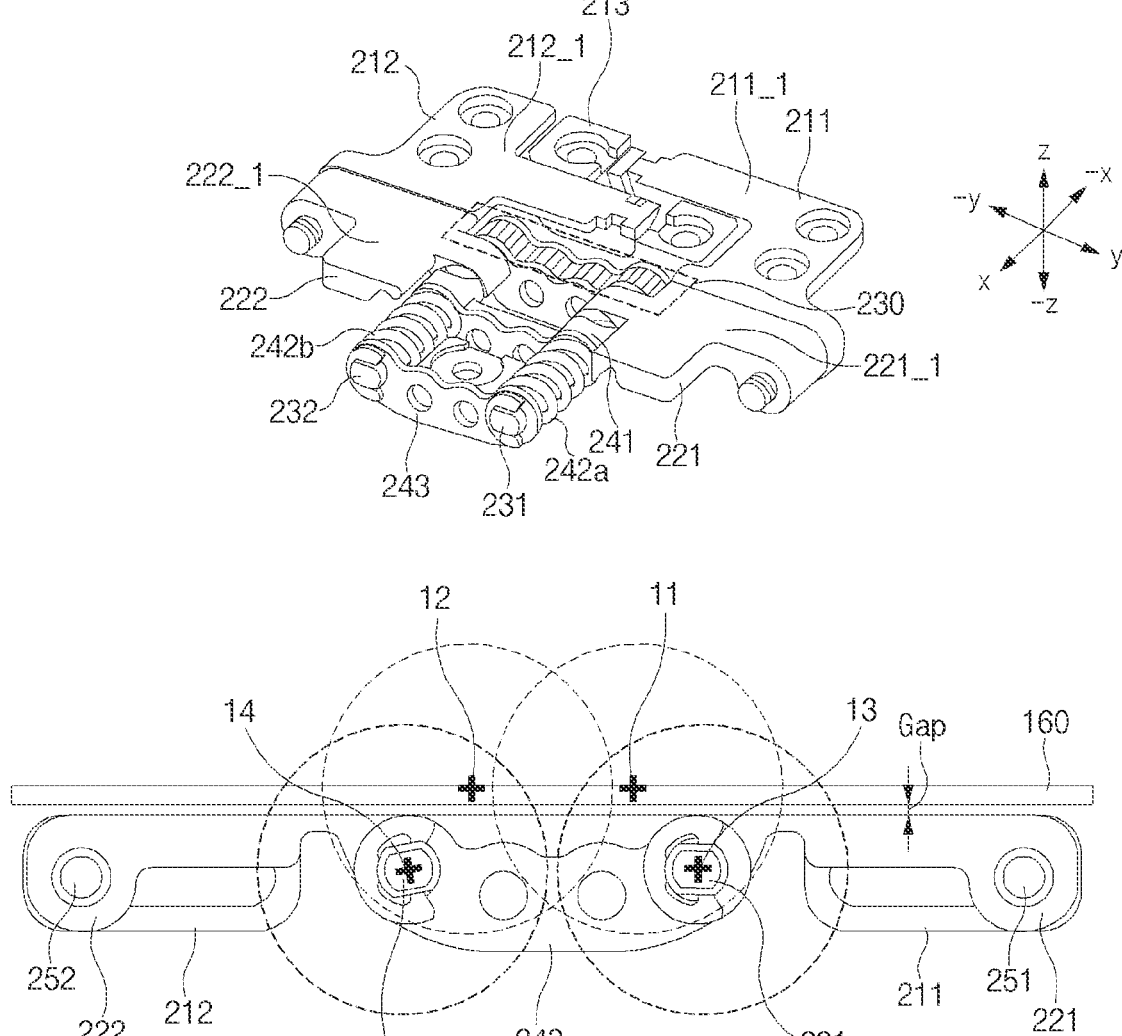
FIG. 3 is a diagram illustrating an example of a hinge structure of an example electronic device according to various embodiments.
Figure 4:
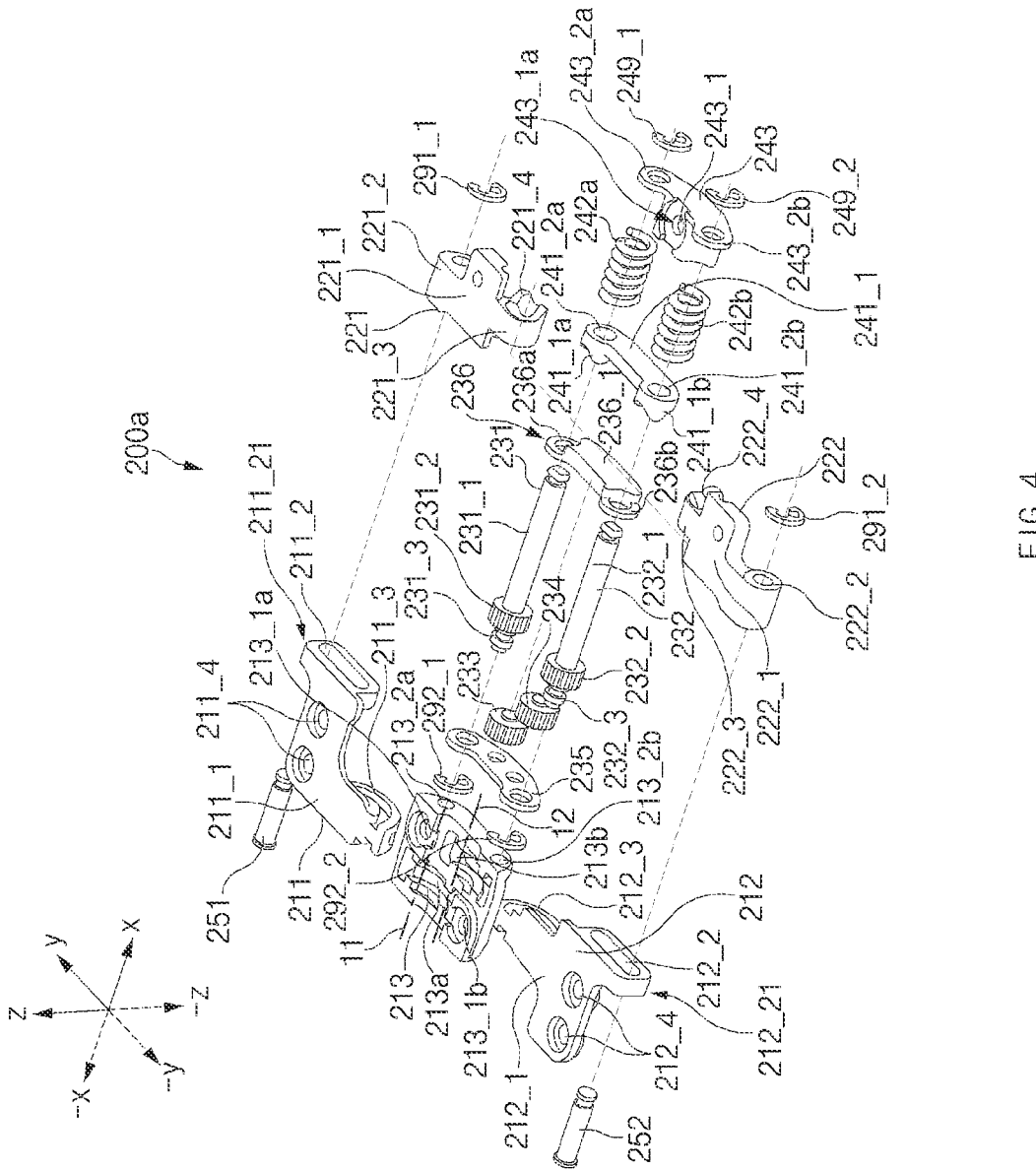
FIG. 4 is an exploded perspective view of an example hinge structure according to various embodiments.

FIG. 3 is a diagram illustrating an example of the hinge structure of an example electronic device according to various embodiments. FIG. 4 is an exploded perspective view of the hinge structure according to various embodiments.

In FIGS. 3 and 4, the first hinge structure 200a of the hinge structures 200a and 200b will be described as an example. The configuration of the first hinge structure 200a described in FIG. 4 may have the same structure and configuration as that of the second hinge structure 200b described above.

Referring to FIGS. 3 and 4, the first hinge structure 200a may include a fixing bracket 213, a first rotation part 211 that is rotatable about a first imaginary axis 11 (or a first axis), a second rotation part 212 that is rotatable about a second imaginary axis 12 (or a second axis), a first fixing pin 251 (or a first fixing part), a second fixing pin 252 (or a second fixing part), a first arm part 221 that is rotatable a first rotary shaft 13, a second arm part 222 that is rotatable about a second rotary shaft 14, a first rotation member 231 corresponding to the first rotary shaft 13, a second rotation member 232 corresponding to the second rotary shaft 14, a stopper 236, a cam part 241, a first elastic body 242*a*, a second elastic body 242*b*, a support bracket 243, a first idle gear 233, a second idle gear 234, a support plate 235, and a plurality of fixing clips 291_1, 2912, 292_1, 292_2, 2491, and 249_2. At least a portion of the above-described configurations of the first hinge structure 200*a* may be formed of a metallic material, and may have a specific strength. Alternatively, if necessary or desirable, the first hinge structure 200*a* may be formed of a material, such as reinforced plastic or a resin. According to various embodiments, at least a portion of the first hinge structure 200*a* may be omitted or modified. Alternatively, a specific structure or configuration may be integrated with or combined with another structure or configuration. For example, the support plate 235 may be integrated with the fixing bracket 213.

At least a portion of a shape of a lower surface (e.g., a surface in the −z axis direction) of the fixing bracket 213 may include a curved surface. For example, at least a portion of the lower surface of the fixing bracket 213 may be formed to correspond to an inner shape of the hinge housing 150. At least a portion of an upper surface (e.g., a surface in the z axis direction) of the fixing bracket 213 may have a flat shape, and may have rail grooves 213*a* and 213*b* such that the rotation parts 211 and 212 are coupled thereto. According to an embodiment, at least a portion of the fixing bracket 213 on a cross-section in a direction of the lower surface (e.g., the surface in the −z axis direction) from the upper surface (e.g., the surface in the z axis direction) may include an arc shape. The fixing bracket 213 may include the first rail groove 213*a*, into which a first rail 211_3 of the first rotation part 211 is inserted in a second direction (e.g., the −y axis direction) from a first direction (e.g., the y axis direction). According to an embodiment, at least a portion of the fixing bracket 213 on a cross-section in a direction of the lower surface (e.g., the surface in the −z axis direction) from the upper surface (e.g., the surface in the z axis direction) may include an arc shape. The fixing bracket 213 may include the second rail groove 213*b*, into which a second rail 212_3 of the second rotation part 212 is inserted in the first direction (e.g., the y axis direction) from the second direction (e.g., the −y axis direction). With respect to the first imaginary axis 11 or the second imaginary axis 12 (or with respect to the x axis that crosses a center between the first rotation member 231 and the second rotation member 232), the first rail groove 213*a* may be disposed to be inclined in the y axis direction as compared with the second rail groove 213*b* and the second rail groove 213*b* may be disposed to be inclined in the −y axis direction as compared with the first rail groove 213*a*. The first rail 211_3 inserted into the first rail groove 213*a* may be rotated about the first imaginary axis 11, and the second rail 212_3 inserted into the second rail groove 213*b* may be rotated about the second imaginary axis 12. The first imaginary axis 11 and the second imaginary axis 12 may be formed on an upper side (air) of the upper surface (e.g., the surface in the z axis direction) of the fixing bracket 213.

According to an embodiment, the first imaginary axis 11 and the second imaginary axis 12 may be formed to be spaced apart from each other by a specific distance. According to various embodiments, a distance between the first imaginary axis 11 and the second imaginary axis 12 may be formed to be smaller than a distance between the first rotary shaft 13 and the second rotary shaft 14. According to various embodiments, the first imaginary axis 11 and the second imaginary axis 12 may be formed on an upper side of the first rotary shaft 13 and the second rotary shaft 14.

According to an embodiment, the fixing bracket 213 may include a first holding recess 213_2*a* formed on a side part disposed in a third direction (e.g., the x axis direction) and in which one end (e.g., at least a portion of a first seating part 231_3) of the first rotation member 231 is seated, and a second holding recess 213_2*b*, in which one end (e.g., at least a portion of the second seating part 232_3) of the second rotation member 232 is seated.

According to various embodiments, the fixing bracket 213 may include a first fixing hole 213_1*a* and a second fixing hole 213_1*b* used to fix the fixing bracket 213 to the hinge housing 150. According to the electronic device 100, the fixing bracket 213 may be fixed to the hinge housing 150 using a coupling member (e.g., a screw or the like). According to an embodiment, the first fixing hole 213_1*a* and the second fixing hole 213_1*b* may be disposed to be symmetrical to each other on an upper surface (e.g., a surface in the z axis direction) of the fixing bracket 213 in a diagonal direction to fix the fixing bracket 213 to the hinge housing 150 more firmly and stably.

The first rotation part 211 may include a first bracket body 211_1, a first sliding part 211_21 formed at one end (e.g., an end in the x axis direction) of the first bracket body 211_1, a first slide hole 2112, the first rail 211_3 formed at an opposite end (e.g., an end in the −y axis direction) of the first bracket body 211_1, and a first housing coupling hole 211_4 used for coupling to the first housing 110.

The first bracket body 211_1 may have a generally "L" shape as a whole. An upper surface (e.g., a surface disposed in the z axis direction) of the first bracket body 211_1 may be formed to be flat. With reference to the illustrated drawing, the first sliding part 211_21 including the first slide hole 211_2 may be disposed in a downward direction (e.g., the −z axis direction) at a right end (e.g., an end in the x axis direction) of the first bracket body 211_1, and the first rail 211_3 may be disposed on a lower surface (e.g., a surface in the −z axis direction) of one end (e.g., an end in the −y axis direction) of the first bracket body 211_1.

The first sliding part 211_21 may include the first slide hole 211_2 (or a first slot), and may be disposed at an opposite end (e.g., an end in the x axis direction) of the first bracket body 211_1 and may protrude in a downward direction of the first bracket body 211_1. Lengths of the first sliding part 211_21 and the first slide hole 211_2 in the first direction (e.g., the y axis direction) may be larger than those in a third direction (e.g., the x axis direction). Accordingly, the first fixing pin 251 inserted into the first slide hole 211_2 may be slid in any one of the first direction (e.g., the y axis direction) and the second direction (e.g., the −y axis direction) in the first slide hole 211_2 in correspondence to a folding or unfolding operation of the electronic device 100. The first sliding part 211_21 and the first slide hole 2112 may be disposed to face a surface (e.g., a surface disposed in the −x axis direction) of the first arm part 221 in a fourth direction. At least partial areas of the first sliding part 211_21 and the first slide hole 211_2 may be aligned with a first connection part 221_2 of the first arm part 221. Accordingly, at least a portion of the first fixing pin 251 may be disposed on an inside of the first slide hole 211_2 and the first connection part 221_2. According to various embodiments, at least a portion of the first slide hole 211_2 may be configured such that a size of the hole becomes smaller as it goes in the −x axis direction from the x axis. At least a portion of the protrusion of the first arm part 221 may be disposed at at least a portion in the first slide hole 211_2. According to an embodiment, one point of the protrusion of the first arm part 221 may contact one point on an inner wall of the first slide hole 211_2.

The first rail 211_3 may be disposed at an end (e.g., an end in the −y axis direction) of the first bracket body 2111 in the second direction, and may protrude in a downward direction of the first bracket body 211_1. At least a portion of the first rail 2113 may have an arc shape of a specific angle. At least a portion of the first rail 211_3 may be inserted into the first rail groove 213a disposed in the fixing bracket 213, and may be rotated in a specific angle range along the first rail groove 213a. According to an embodiment, the rotation range of the first rail 2113, for example, may be a range of −10 degrees to 100 degrees (or a range of 0 degrees to 90 degrees). The first rail 211_3 may be rotated in the clockwise or counter-clockwise direction between the y axis and the z axis with respect to the first imaginary axis 11 defined by the first rail groove 213a.

The first housing coupling hole 211_4 may be formed on one side (e.g., a periphery on one side that faces the y axis direction) of the first bracket body 211_1, and may be formed to pass through a surface (e.g., a surface in the y axis direction) in the first direction and a surface (e.g., a surface in the −y axis direction) in the second direction. In the illustrated example in the drawings, two first housing coupling holes 211_4 are formed in the first bracket body 211_1, but the disclosure is not limited to the number. The coupling member (e.g., a screw) may be coupled to a boss or the like that is provided in the first housing 110 while passing through at least a portion of the first housing coupling hole 211_4 to fix the first rotation part 211 to the first housing 110.

The second rotation part 212 may include a second bracket body 212_1, a second sliding part 212_21 and a second slide hole 212_2 that are formed at one end (e.g., an end in the x axis direction) of the second bracket body 212_1, the second rail 212_3 formed at an opposite end (e.g., an end in the y axis direction) of the second bracket body 2121, and a second housing coupling hole 212_4 used for coupling to the second housing 120.

The second bracket body 2121 may have substantially the same shape as that of the first bracket body 211_1. Accordingly, an upper surface (e.g., a surface disposed in the z axis direction) of the second bracket body 2121 may be formed to be flat.

The second sliding part 21221 may include the second slide hole 212_2, may be disposed on a right end (e.g., an end in the x axis direction) of the second bracket body 2121, and may be disposed on a lower side of the second bracket body 212_1. The second sliding part 212_21 and the second slide hole 212_2 may be disposed to be symmetrical to the first sliding part 21121 and the first slide hole 211_2 with respect to the fixing bracket 213. The second sliding part 212_21 and the second slide hole 212_2 may have the same shapes as those of the first sliding part 211_21 and the first slide hole 211_2. According to an embodiment, an interior shape of the second slide hole 212_2 may vary as it goes in the −x axis direction from the x axis direction. For example, a size of an inlet part (e.g., a part in the x axis direction) of the second slide hole 212_2 may be larger than a size of an outlet part (e.g., a part in the −x axis direction). At least a portion of the protrusion of the second arm part 222 may be disposed at at least a portion of the inlet part of the second slide hole 212_2.

The second rail 2123 may be disposed at an end (e.g., an end in the y axis direction) of the second bracket body 212_1 in the first direction, and may be disposed on a lower side of the second bracket body 212_1. The second rail 212_3 may have substantially the same shape as that of the first rail 211_3, and at least a portion of the second rail 212_3 may be inserted into the second rail groove 213b. The second rail 2123 may be rotated in a specific angle range, for example, in a range of 80 degrees to 190 degrees (or 90 degrees to 180 degrees) with respect to the second imaginary axis 12. For example, the second rail 212_3 may be rotated in the counterclockwise direction or the clockwise direction (e.g., in an opposite direction to the first rail 211_3) within a range between the −y axis and the z axis.

The second housing coupling hole 2124 may be formed on one side (e.g., a periphery on one side that faces the y axis direction) of the second bracket body 2121, and may be formed to pass through a surface (e.g., a surface in the y axis direction) in the first direction and a surface (e.g., a surface in the −y axis direction) in the second direction.

The first arm part 221 may be connected to one side of the first rotation part 211 through the first fixing pin 251, and may be rotated within a specific angle range in association with the first rotation part 211 during a hinge operation. According to an embodiment, the first arm part 221 may include a first basic body 2211, the first connection part 2212, a first insertion part 221_3, and a first rotary cam 221_4.

An upper surface (e.g., a surface disposed to face the z axis direction) of the first basic body 2211 may be formed to be flat. The first connection part 221_2 may be disposed on a lower surface (e.g., a surface in the −z axis direction) of an upper periphery (e.g., an y axis end) of the first basic body 221_1. The first connection part 221_2 may include a connection hole that is opened in the fourth direction (e.g., the −x axis direction). At least a portion of the first fixing pin 251 may be seated on and fixed to the first connection part 221_2. The first connection part 2212 may include a shape of a protrusion that protrudes in the −x axis direction, and at least a portion of the protrusion may be held in the first slide hole 211_2.

The first insertion part 2213 may be disposed on a lower surface (e.g., a surface in the −z axis direction) of a lower periphery (e.g., a −y axis end) of the first basic body 221_1. The first insertion part 221_3 may include a hole, which is opened in the fourth direction (e.g., the −x axis direction) and at least a portion of which is angular. At least a portion of the first rotation member 231 may be seated in the first insertion part 221_3. The first rotary cam 221_4 may be disposed on one side (e.g., an end in the x axis direction) of the first insertion part 221_3.

The first rotary cam 221_4 may include at least one mountain and at least one valley that are disposed in a direction (the x axis direction), in which the first rotation member 231 is inserted into the first insertion part 221_3 to protrude. According to an embodiment, ends of the mountain and the valley may include a flat area of a specific length. Accordingly, a section, in which ends of the mountain of the first rotary cam 221_4 and the mountain of a first fixed cam 241_1a of the cam part 241 contact each other while the first rotary cam 221_4 is engaged with the first fixed cam 241_1a to be rotated, may be formed by a specific width. When the section, in which ends of the mountain of the first rotary cam 221_4 and the mountain of the first fixed cam 241_1a contact each other, is formed by the specific width, a holding state of the first housing 110 and the second housing 120 at a specific angle may be maintained more firmly in the corresponding section, and holding state (a state, in which the folding angle is maintained at a specific angle when no additional pressure is applied) of various angle ranges may be provided.

The second arm part 222 may have substantially the same configuration as that of the first arm part 221. For example, the second arm part 222 may include a second basic body 2221, a second connection part 222_2, a second insertion part 2223, and a second rotary cam 222_4. The second basic body 222_1 may be disposed to be symmetrical to the first basic body 221_1, and the second connection part 2222 may be coupled to one side of the second fixing pin 252. The second connection part 2222 may include a protrusion that protrudes in the −x axis direction, and at least a portion of the protrusion of the 25 second connection part 222_2 in the −x axis direction may be held inside the second slide hole 212_2. The second rotation member 232 may be inserted into the second insertion part 2223, and the second rotary cam 222_4 may be disposed to be engaged with a second fixed cam 241_1b of the cam part 241.

One end of the first rotation member 231 may be seated on the first holding recess 213_2a formed in the fixing bracket 213, may be geared with the first idle gear 233, may be disposed to pass through the stopper 236, the first insertion part 2213, the first rotary cam 2214, the first fixed cam 241_1a of the cam part 241, and the first elastic body 242a, and may be fixed to the support bracket 243. The first rotation member 231 may include a first shaft body 231_1, a first shaft gear 231_2, and the first seating part 231_3.

The first shaft body 231_1 may have a length, by which it may pass through the stopper 236, the first insertion part 2213, the first rotary cam 221_4, the first fixed cam 241_1a, the first elastic body 242a, and a first support bracket hole 243_2a of the support bracket 243. The first shaft body 231_1 may be coupled to the first rotary cam 2214, and may have a shape, of which a y axis cross-section is angular, such that the first rotary cam 221_4 is rotated while it is rotated by an external pressure. For example, the first shaft body 231_1 may include a plurality of flat surfaces in a lengthwise direction (e.g., the x axis direction or the −x axis direction). Correspondingly, an inner wall of the first insertion part 2213, on which the first rotary cam 2214 is disposed, may have a shape corresponding to a cross-section of the first shaft body 231_1. The first shaft gear 2312 may be disposed to be inclined in the fourth direction (e.g., the −x axis direction) of the first shaft body 231_1. The first shaft gear 231_2 may be disposed to be geared with the first idle gear 233.

The first seating part 231_3 may protrude further toward a surface (e.g., a surface in the −x axis direction) of the first shaft gear 2312 in the fourth direction. At least a portion of the first seating part 2313 may pass through a guide hole formed in the support plate 235, and may be seated in the first holding recess 213_2a formed in the fixing bracket 213. As the first fixing pin 251 fixes the first rotation part 211 and the first arm part 221, the first seating part 231_3 may be firmly fixed to the first holding recess 213_2a to prevent separation or distortion of the first shaft body 231_1.

One end of the second rotation member 232 may be seated in the second holding recess 213_2b formed in the fixing bracket 213. One end of the second rotation member 232 may be geared with the second idle gear 234 and may be disposed to pass through the stopper 236, the second insertion part 2223, the second rotary cam 222_4, the second fixed cam 241_1b of the cam part 241, and the second elastic body 242b, and an opposite end of the second rotation member 232 may be fixed to the support bracket 243. The second rotation member 232 may include a second shaft body 2321, a second shaft gear 232_2, and the second seating part 232_3.

The second shaft body 2321 may have a length, by which it may pass through the stopper 236, the second insertion part 2223, the second rotary cam 222_4, the second fixed cam 241_1b, the second elastic body 242b, and a second support bracket hole 243_2b of the support bracket 243. The second shaft body 2321 may substantially have the same shape and size as those of the first shaft body 2311. The second shaft body 2321 may be disposed at a location that is spaced apart from the first shaft body 231_1 by a specific length. The second shaft gear 2322 may have the same shape and size as those of the first shaft gear 2312, and may be disposed on the second shaft body 232_1. A disposition location of the second shaft gear 232_2 may be symmetrical to a disposition location of the first shaft gear 231_2. At least a portion of the second seating part 2323 may have the same shape and size as those of the first seating part 2313, and may be seated in the second holding recess 213_2b. In this process, at least a portion of the second seating part 2323 may pass through a guide hole of the support plate 235 and may be seated in the second holding recess 213_2b. The second seating part 2323 may be seated in the second holding recess 213_2b more firmly in a process of the second fixing pin 252 fixing the second rotation part 212 and the second arm part 222.

The first fixing pin 251 may have a shape of a nail or a screw that has a specific length in one direction (e.g., the x axis or the −x axis). The first fixing pin 251 may be formed to be longer than a sum of a hole length of the first slide hole 211_2 and a hole length of the first connection part 221_2 of the first arm part 221. The first fixing pin 251 may be inserted into the first slide hole 211_2 and the first connection part 2212, and then opposite sides thereof may be fixed. A diameter of one side of the first fixing pin 251 may be formed to be smaller than a diameter of the first connection part 221_2. At least a portion of the first fixing pin 251 may be located in the first slide hole 2112, and may be slid in the y axis or −y axis direction. At least a portion of the first fixing pin 251 may be fixed by the first arm part 221.

The second fixing pin 252 may have substantially the same shape as that of the first fixing pin 251. The second fixing pin 252 may be disposed at a location that is symmetrical to the first fixing pin 251 with respect to the fixing bracket 213, and at least a portion thereof may be inserted into and fixed to the second slide hole 212_2 and the second connection part 222_2. One side of the second fixing pin 252 may be slid in the second slide hole 2122 in the y axis or −y axis direction.

The stopper 236 may support a specific pressure (or resist against the corresponding pressure) when the corresponding pressure is applied such that the first arm part 221 and the second arm part 222 are prevented from being rotated by a specific angle or more. The stopper 236 may include a stopper body 236_1, a first shaft insertion hole 236a, into which the first shaft body 231_1 of the first rotation member 231 is inserted, and a second shaft insertion hole 236b, into which the second shaft body 232_1 of the second rotation member 232 is inserted.

According to various embodiments, the stopper body 236_1 may be formed to protrude further than surfaces of the first shaft insertion hole 236a and the second shaft insertion hole 236b in the third direction (e.g., the x axis direction). The stopper body 2361 may be formed or disposed to restrict a rotation range of one side (e.g., a surface of the first insertion part in the fourth direction (e.g., a surface in the −x axis direction)) of the first arm part 221 while the first arm part 221 is rotated, and to restrict a rotation range of one side (e.g., a surface of the second insertion part in the fourth direction (e.g., a surface in the −x axis direction)) of the second arm part 222 while the second arm part 222 is rotated.

Sides (e.g., surfaces in the x axis direction) of the first shaft insertion hole 236*a* and the second shaft insertion hole 236*b* may be disposed to face a surface (e.g., a surface in the −x axis direction) of the first insertion part 221_3 of the first arm part 221 in the fourth direction and a surface (e.g., a surface in the −x axis direction) of the second insertion part 2223 in the fourth direction. A surface (e.g., a surface in the x axis direction) of the stopper body 2361 in the third direction may be disposed to face a surface (e.g., a surface in the −x axis direction) of a cam body 2411 of the cam part 241 in the fourth direction.

The cam part 241 may include the cam body 2411, the first fixed cam 241_1*a*, a second fixed cam 241_1*b*, a first cam hole 241_2*a*, and a second cam hole 241_2*b*. The cam body 2411 may have a specific length, and the first fixed cam 241_1*a* and the second fixed cam 241_1*b* may be disposed at opposite peripheries thereof. A surface (e.g., a surface in the −x axis direction) of the cam body 241_1 in the fourth direction may be disposed to face a surface (e.g., a surface in the x axis direction) of the stopper body 236_1 in the third direction. A mountain and a valley may be disposed in the first fixed cam 241_1*a* in the fourth direction (e.g., the −x axis direction), and the first cam hole 241_2*a* may be formed at a central portion thereof such that the first rotation member 231 passes therethrough. The first fixed cam 241_1*a* may be disposed to be engaged with the first rotary cam 221_4. One side of the first elastic body 242*a* may contact a surface (e.g., a surface in the x axis direction) of the first fixed cam 241_1*a* in the third direction. The second fixed cam 241_1*b* may be disposed in the same direction as that of the first fixed cam 241_1*a*, and may be disposed to be spaced apart from the first fixed cam 241_1*a* by a length of the cam body 241_1. The second fixed cam 241_1*b* may be disposed to be engaged with the second rotary cam 222_4, and the second elastic body 242*b* may contact a surface (e.g., a surface in the x axis direction) of the second fixed cam 241_1*b* in the third direction. The second cam hole 241_2*b* may be formed at a central portion of the second fixed cam 241_1*b* such that the second rotation member 232 passes therethrough.

According to various embodiments, the cam part 241 may be moved rearwards in the third direction (e.g., the x axis direction) by the first rotary cam 221_4 and the second rotary cam 222_4 while the first arm part 221 and the second arm part 222 are rotated in a specific angle range, and may be moved in the fourth direction (e.g., the −x axis direction) by elasticity of the first elastic body 242*a* and the second elastic body 242*b* when the mountains and the valleys of the cams are engaged with each other, and then may return to an original location.

A central portion of the first elastic body 242*a* may have a hollow spring shape. The first shaft body 231_1 of the first rotation member 231 that passes through the first fixed cam 241_1*a* may be seated at a central portion of the first elastic body 242*a*. The first elastic body 242*a* and the second elastic body 242*b* may be disposed between the cam part 241 and the support bracket 243, and may be operated to push the cam part 241 in the fourth direction (e.g., the −x axis direction) as the support bracket 243 is fixed. The second elastic body 242*b* may be disposed to be spaced apart from the first elastic body 242*a* by a specific distance, and may be disposed to contact a surface (e.g., a surface in the x axis direction) of the second fixed cam 241_1*b* in the third direction.

The support bracket 243 may include a support part 2431, the first support bracket hole 243_2*a*, and the second support bracket hole 243_2*b*. The support part 2431 may include a through-hole 243_1*a* that passes therethrough in an upward/downward direction (e.g., in the −z axis direction from one point in the z axis). The through-hole 243_1*a* may be used to fix the support bracket 243 to the hinge housing 150. The first support bracket hole 243_2*a* may be disposed to protrude from one side of the support part 2431, and may support one side of the first elastic body 242*a*. Furthermore, one end of the first rotation member 231 may be inserted into the first support bracket hole 243_2*a*. The second support bracket hole 243_2*b* may be disposed at a location that is spaced apart from the first support bracket hole 243_2*a* by a specific distance, may be disposed to protrude from one side of the support part 2431, and may support one side of the second elastic body 242*b*. Furthermore, one end of the second rotation member 232 may be inserted into the second support bracket hole 243_2*b*.

The first idle gear 233 may be disposed between the first shaft gear 231_2 and the second shaft gear 232_2 such that one side thereof is geared with the first shaft gear 231_2 and an opposite side thereof is geared with the second idle gear 234. The first idle gear 233 may include a boss that is inserted into the guide hole formed in the support plate 235, and a boss that is fixed to a surface (e.g., a surface in the −x axis direction) of the stopper 236 in the fourth direction.

The second idle gear 234 may be disposed between the first shaft gear 231_2 and the second shaft gear 232_2 such that one side thereof is geared with the first idle gear 233 and an opposite side thereof is geared with the second shaft gear 2322. The second idle gear 234 may be formed to have substantially the same shape and size as those of the first idle gear 233. Accordingly, the second idle gear 234 may include a boss that is inserted into the guide hole formed in the support plate 235, and a boss that is fixed to a surface (e.g., a surface in the −x axis direction) of the stopper 236 in the fourth direction. In this regard, recesses or holes for holding the boss of the first idle gear 233 and the boss of the second idle gear 234 may be formed on a surface (e.g., a surface in the −x axis direction) of the stopper 236 in the fourth direction.

The support plate 235 may be disposed between the fixing bracket 213 and the rotation members 231 and 232, and may be disposed to prevent separation of the rotation members 231 and 232 and the idle gears 233 and 234. In this regard, the support plate 235 may include a plurality of guide holes. For example, the support plate 235 may include a guide hole through which the first seating part 231_3 of the first rotation member 231 passes, a guide hole through which the second seating part 2323 of the second rotation member 232 passes, and guide holes (or guide grooves), in which the bosses of the first idle gear 233 and the bosses of the second idle gear 234 are seated.

The plurality of fixing clips 2911, 2912, 2921, 292_2, 249_1, and 249_2 may be disposed such that one or more configurations included in the first hinge structure 200*a* are fixed not to be separated from the corresponding locations and the corresponding configurations are rotated. The plurality of fixing clips 291_1, 2912, 292_1, 292_2, 249_1, and 2492, for example, may include C-clips. The plurality of fixing clips 2911, 2912, 2921, 292_2, 249_1, and 2492, for example, may include the first fixing clip 2911 for fixing the first fixing pin 251 to a surface (e.g., a surface in the x axis direction) of the first connection part 221_2 in the third direction, the second fixing clip 291_2 for fixing the second fixing pin 252 to a surface (e.g., a surface in the x axis direction) of the second connection part 222_2 in the third direction, the third fixing clip 2921 that is fixed to the first seating part 231_3 of the first rotation member 231 such that the first seating part 2313 is prevented from being separated from the support plate 235, the fourth fixing clip 2922 that is fixed to the second seating part 232_3 of the second rotation member 232 such that the second seating part 232_3 is prevented from being separated from the support plate 235, the fifth fixing clip 2491 coupled to an end of the first rotation member 231 such that the first rotation member 231 is prevented from being separated from the first support bracket hole 243_2a of the support bracket 243, and the sixth fixing clip 2492 coupled to an end of the second rotation member 232 such that the second rotation member 232 is prevented from being separated from the second support bracket hole 243_2b of the support bracket 243.

Figure 5:
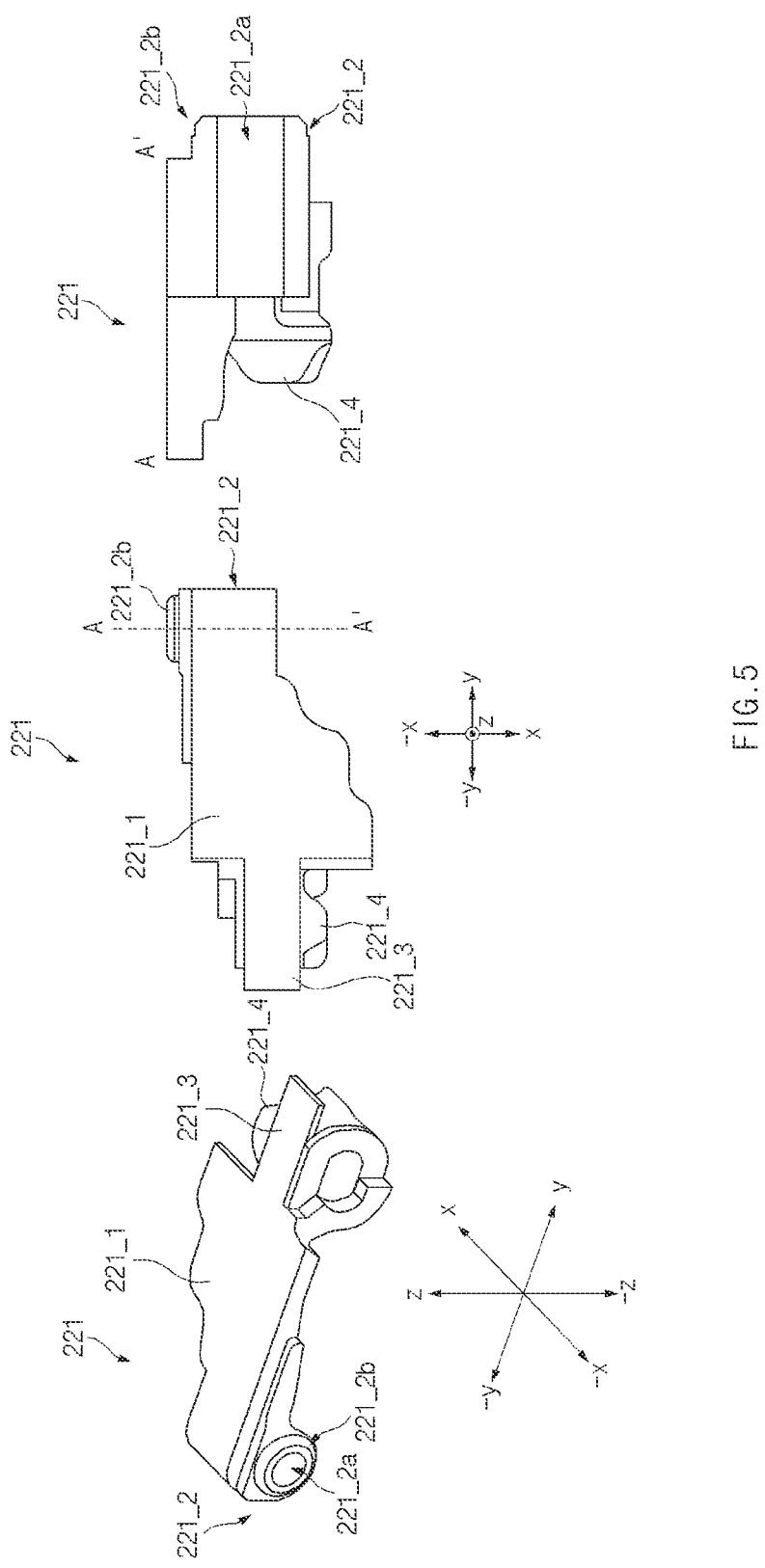
FIG. 5 is a diagram illustrating an example of a first arm part of an example electronic device according to various embodiments.

FIG. 5 is a diagram illustrating an example of an example first arm part of the electronic device according to various embodiments. According to various embodiments, the above-described second arm part may have a structure that is the same as or similar to that of the first arm part. Hereinafter, a form of the arm part applied to the electronic device will be described while the first arm part is taken as a representative.

Referring to FIGS. 4 and 5, the first arm part 221, as described above in FIG. 3, may include the first basic body 2211, the first connection part 221_2, the first insertion part 2213, and the first rotary cam 221_4.

The first connection part 2212 may be disposed at a y axis periphery of the first basic body 221_1 and may be formed to protrude in the −z axis direction. The first connection part 221_2 may include a first connection hole 221_2a, which is formed to pass through the −x axis and the x axis and into which the first fixing pin 251 is inserted, and a first protrusion 221_2b that is formed around an inlet of the first connection hole 221_2a in the −x axis direction and protrudes in the −x axis direction.

The first protrusion 221_2b may have a band shape or a ring shape. According to an embodiment, the first protrusion 221_2b may be disposed to surround a periphery of the first connection hole 221_2a in the x axis direction. According to an embodiment, a central portion of the first protrusion 221_2b may be disposed to extend from a periphery of the first connection hole 221_2a in the −x axis direction, in the −x axis direction. The first protrusion 221_2b may be formed to have a specific curvature in the −x axis direction. According to an embodiment, a thickness of the first protrusion 221_2b in the z axis direction may become gradually smaller as it goes from the x axis in the −x axis direction. For example, as illustrated, in consideration of cross-section A-A', a thickness of the first protrusion 221_2b in the z axis direction may be formed to become smaller as it goes to an outside (e.g., a direction of a periphery in the −x axis direction) of the first connection hole 221_2a. Alternatively, the first protrusion 221_2b may be formed to have a curvature of a specific size from a center of the first connection hole 221_2a outwards, and may have a shape that is convex in the −x axis direction.

According to various embodiments, the second arm part 222 disposed at a location that is symmetrical to the first arm part 221 also may have the same structure as that of the first arm part 221. For example, the second connection part 222_2 of the second arm part 222 may include a second connection hole, into which the second fixing pin 252 is inserted, and a second protrusion that is formed to protrude further than surroundings thereof at a peripheral part of an inlet of the second connection hole. The second protrusion may have the same structure, size, and material as those of the first protrusion 221_2b of the first arm part 221.

Figure 6:
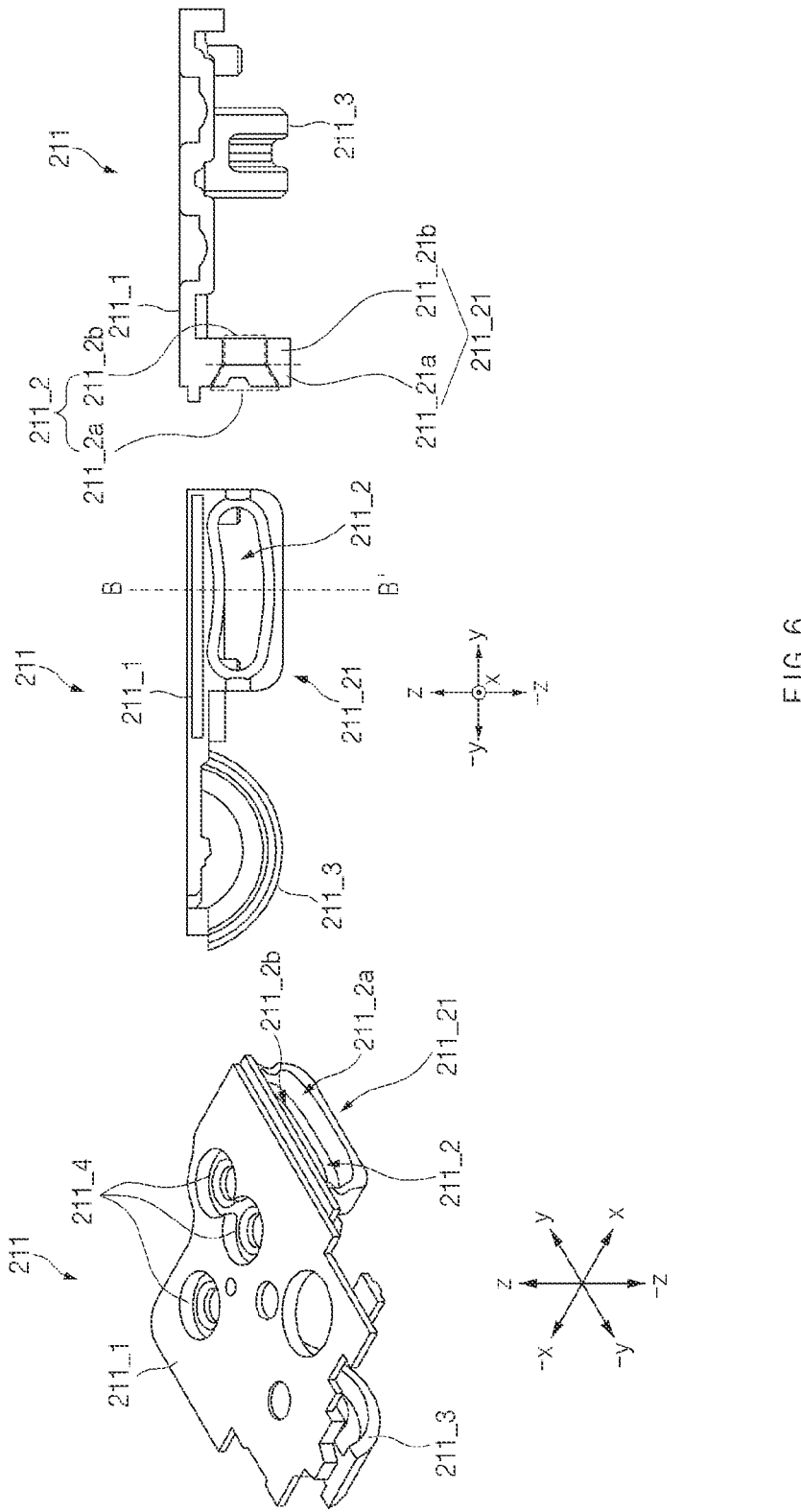
FIG. 6 is a diagram, illustrating an example of a first rotation part of an example electronic device according to various embodiments.

FIG. 6 is a diagram illustrating an example of the first rotation part of the electronic device according to various embodiments. According to various embodiments, the above-described second rotation part may have a structure that is the same as or similar to that of the first rotation part. Hereinafter, a form of the rotation part applied to the electronic device will be described while the first rotation part is taken as a representative.

Referring to FIGS. 4 to 6, the first rotation part 211 may include the first bracket body 211_1, the first slide hole 211_2, the first rail 211_3, and the first housing coupling hole 2114, and the first rotation part 211 may include the first sliding part 211_21, in which the first slide hole 211_2 is formed.

A first holding hole 211_2a may be disposed in the first slide hole 211_2 in the x axis direction, and a second holding hole 211_2b may be disposed in the −x axis direction. At least portions of the first holding hole 211_2a and the second holding hole 211_2b may be formed to be continuous to each other.

The first holding hole 211_2a may have a shape, in which a size of the hole or a size of a space corresponding to the hole gradually decreases as it goes from the x axis to the −x axis. Furthermore, the first holding hole 211_2a may have a shape, in which a size of the hole or a size of a space corresponding to the hole gradually increases as it goes from the −x axis to the x axis. Accordingly, at least a portion of the first holding hole 211_2a may have a trapezoidal shape (or a funnel shape or a shape, of which a distance in a z axis cross-section between a bottom surface and an upper surface of the hole is changed according to a location thereof), of which a space (or a space corresponding to a border area of the first holding hole 211_2a and the second holding hole 211_2b) connected to the second holding hole 211_2b is narrower than a peripheral space in the x axis direction. A size of at least a portion (e.g., a height in the z axis direction) of the first holding hole 211_2a may be a size that is larger than a size of a cross-section of the first fixing pin 251 in the z axis direction. According to various embodiments, the size of the first holding hole 211_2a may be a size (e.g., a similar size) corresponding to a size of the first protrusion 221_2b.

The second holding hole 211_2b may be formed to be continuous to the first holding hole 211_2a. For example, the second holding hole 211_2b may extend from a periphery of the first holding hole 211_2a in the −x axis direction to be formed in the −x axis direction. The second holding hole 211_2b may be formed to correspond to at least a portion of a path, in which the first fixing pin 251 is moved. For example, the second holding hole 211_2b may include a space having a specific curvature in the y axis direction. At least a portion of the first fixing pin 251 may be held in the second holding hole 211_2b. In correspondence to a folding or unfolding operation of the electronic device 100, the second holding hole 211_2b may provide a movement path of the first fixing pin 251 while the first fixing pin 251 is slid in the second holding hole 211_2b in the y axis or −y axis direction. In this regard, a size of the second holding hole 211_2b in the z axis direction may be a size (or a size that is larger than a height of the first fixing pin 251 in the z axis cross-section) that is similar to a size of the first fixing pin 251 in the z axis cross-section.

The first sliding part 211_21 may be disposed at a periphery of the first bracket body 211_1 in the x axis direction, may be formed to protrude in the −z axis direction, and may include the first slide hole 211_2 that is formed to pass therethrough while passing through the x axis or the −x axis. For example, the first sliding part 211_21 may include a first sliding/holding part 211_21a that defines the first holding hole 211_2a, and a second sliding/holding part 211_21b that defines the second holding hole 211_2b. At least portions of outer bottom surfaces of the first sliding/holding part 211_21a and the second sliding/holding part 211_21b in the −z axis and z axis directions may be formed to be flat.

The first sliding/holding part 211_21a may include a hole inner bottom surface and a hole inner upper surface that have specific inclinations in the −x axis direction from the x axis such that a z axis cross-section thereof defines a space of the first holding hole 211_2a having a trapezoidal shape. For example, with reference to the drawing, the hole inner bottom surface of the first sliding/holding part 211_21a may include an inclined surface (an inclined surface having an upward inclination in the z axis direction), by which a spacing distance from at least one point of the hole inner upper surface becomes closer (or shorter) as it goes in the −x axis direction from the x axis. With another reference, the hole inner upper surface of the first sliding/holding part 211_21a may include an inclined surface (an inclined surface having a downward inclination in the −z axis direction), of which a spacing distance from the hole inner bottom surface becomes smaller as it goes in the −x axis direction from the x axis. According to various embodiments, the hole inner bottom surface and the hole inner upper surface of the first sliding/holding part 211_21a may have a convex shape or a concave shape. At least one of the hole inner bottom surface and the hole inner upper surface of the first sliding/holding part 211_21a may be formed to be flat with respect to the x axis and have a specific curvature with respect to the y axis in correspondence to a curved path, in which the first fixing pin 251 is moved. At least one point of the first protrusion 221_2b of the first arm part 221 may contact at least one of the hole inner bottom surface and the hole inner upper surface of the first sliding/holding part 211_21a. The first sliding/holding part 211_21a may guide a sliding operation of one side of the first arm part 221 while the electronic device 100 performs a folding operation or an unfolding operation. The first sliding/holding part 211_21a may include a slot shape having a specific length in the y axis or −y axis direction.

The second sliding/holding part 211_21b may be formed to extend from a periphery of the first sliding/holding part 211_21a in the −x axis direction while having a specific length in the −x axis direction. According to various embodiments, a cross-section of the second sliding/holding part 211_21b in the z axis direction may include a rectangular shape. At least a portion of an inside of the second sliding/holding part 211_21b may define a space corresponding to the second holding hole 211_2b. For example, the second sliding/holding part 211_21b may include a hole inner bottom surface and a hole inner upper surface corresponding to the second holding hole 211_2b. The hole inner bottom surface and the hole inner upper surface of the second sliding/holding part 211_21b may be formed to be flat when observed from the z axis direction or the −z axis direction. The hole inner bottom surface and the hole inner upper surface of the second sliding/holding part 211_21b may have a specific curvature when observed from the y axis direction or the −y axis direction. The second sliding/holding part

211_21b may include a slot shape having a specific length in the y axis or −y axis direction. According to various embodiments, the hole inner bottom surface and the hole inner upper surface of the second sliding/holding part 211_21a may have a convex shape or a concave shape.

According to various embodiments, the electronic device 100 according to an embodiment may include the second rotation part 212 corresponding to the first rotation part 211, and the second rotation part 212 may include the second sliding part 21221 corresponding to the first sliding part 211_21. The second rotation part 212 may include the second slide hole 212_2 including a third holding hole corresponding to the first holding hole 211_2a of the first slide hole 211_2 and a fourth holding hole corresponding to the second holding hole 211_2b of the first slide hole 211_2. Furthermore, the second sliding part 212_21 of the second rotation part 212 may include a third sliding/holding part corresponding to the first sliding/holding part 211_21a and a fourth sliding/holding part corresponding to the second sliding/holding part 211_21b.

Figure 7:
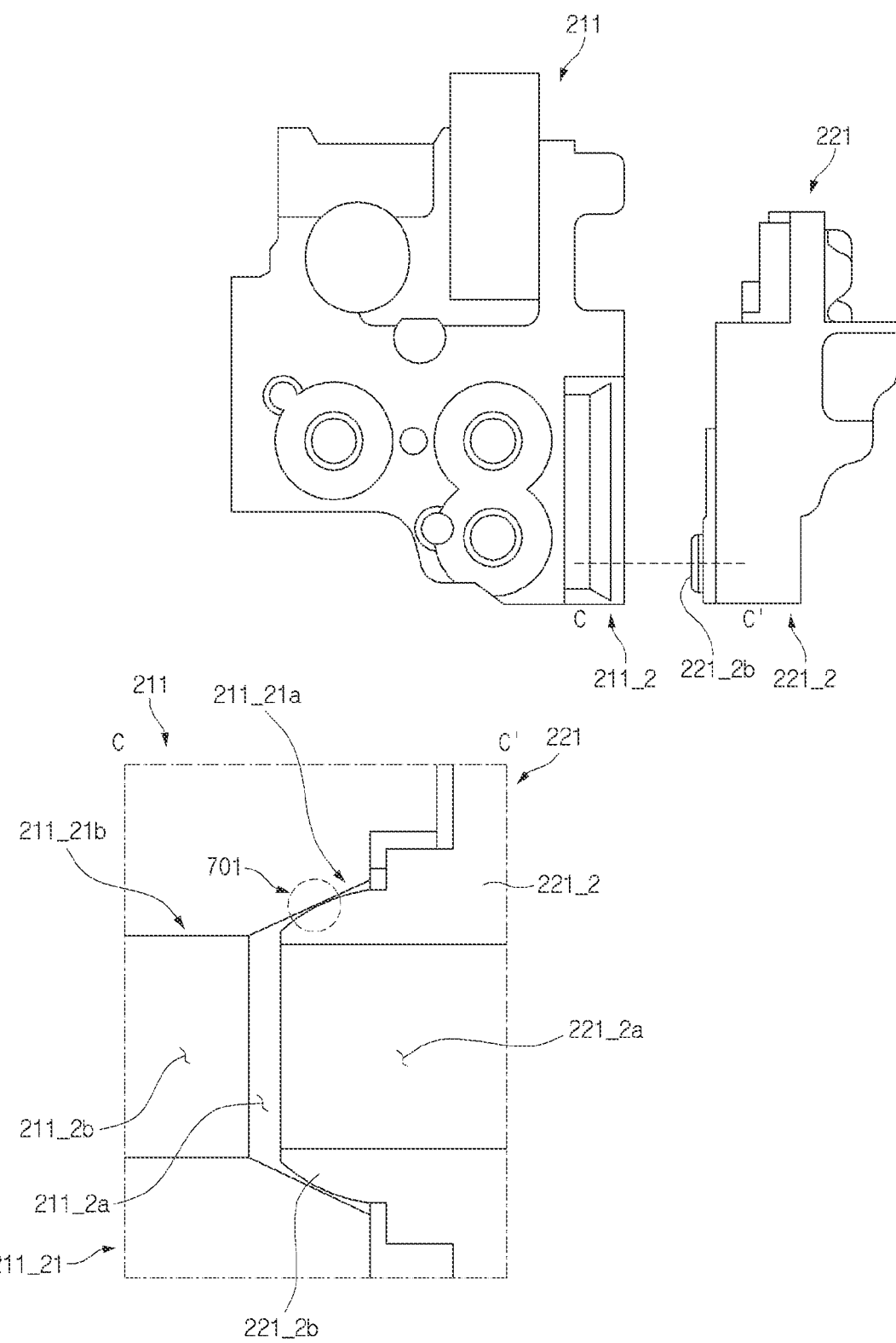
FIG. 7 is a diagram illustrating an example first arm part, an example first rotation part, and some example forms of coupling thereof according to various embodiments.

FIG. 7 is a diagram illustrating an example first arm part, an example first rotation part, and some forms of coupling thereof according to various embodiments.

Referring to FIGS. 5 to 7, as described above, at least a portion of the first protrusion 221_2b of the first arm part 221 may be disposed in the first holding hole 211_2a of the first rotation part 211. The first protrusion 221_2b, as illustrated, may include a curved part, of which an outer surface is convex. According to various embodiments, the first protrusion 221_2b may include a shape, of which an outer surface is inclined. According to various embodiments, the first protrusion 221_2b may have a shape corresponding to a shape of the seated first sliding/holding part 211_21a. For example, when the hole inner bottom surface or the upper surface of the first sliding/holding part 211_21a has a specific inclination, the first protrusion 221_2b may include a surface (or a curved surface as illustrated) having an inclined inclination.

The first sliding/holding part 211_21a of the first rotation part 211 may include a flat part while having a specific inclination. Accordingly, one point of the first protrusion 221_2b may point-contact (701) one point of the hole inner bottom surface and the hole inner upper surface of the first sliding/holding part 211_21a. Alternatively, at least a portion of an outside of the first protrusion 221_2b may line-contact the first sliding/holding part 211_21a. As the first connection part 221_2 of the first arm part 221 and the first sliding part 211_21 of the first rotation part 211 are coupled to each other, the first connection hole 211_2a and the second holding hole 211_2b inside the first sliding part 211_21 may be disposed to be continuous to the first connection hole 221_2a of the first arm part 221.

As described above, the first protrusion 221_2b of the first connection part 221_2 may maintain a contact state with at least one of the hole inner bottom surface and the hole inner upper surface of the first sliding part 211_21. Accordingly, the first arm part 221 and the first rotation part 211 may be prevented from being moved through a contact of the first protrusion 221_2b and the first sliding part 211_21. The first fixing pin 251, one side of which is inserted into the first connection hole 221_2a of the first arm part 221 and an opposite side of which is disposed in the first slide hole 211_2 of the first rotation part 211, may be maintained in a fixed state (e.g., movement thereof is prevented) while a state of the electronic device 100 is changed to the folded state or the unfolded state as the contact state of the first arm part 221 and the second rotation part 212 is maintained.

Because the contact state of the first arm part 221 and the second rotation part 212 is maintained, movement of the arm part and the rotation part may be prevented (or reduced) even when an external pressure occurs whereby shaking of the first arm part 221 and the second rotation part 212 may be restrained or alleviated. Collision of the first fixing pin 251 and a peripheral structure may be restrained, and thus seaming of the electronic device 100 may be alleviated or restrained. Furthermore, because collision of the first fixing pin 251 and a peripheral structure is restrained, generation of dust due to the collision or friction may be alleviated, and thus a wearing performance of the first fixing pin 251 and the peripheral structure may be improved.

Figure 8:
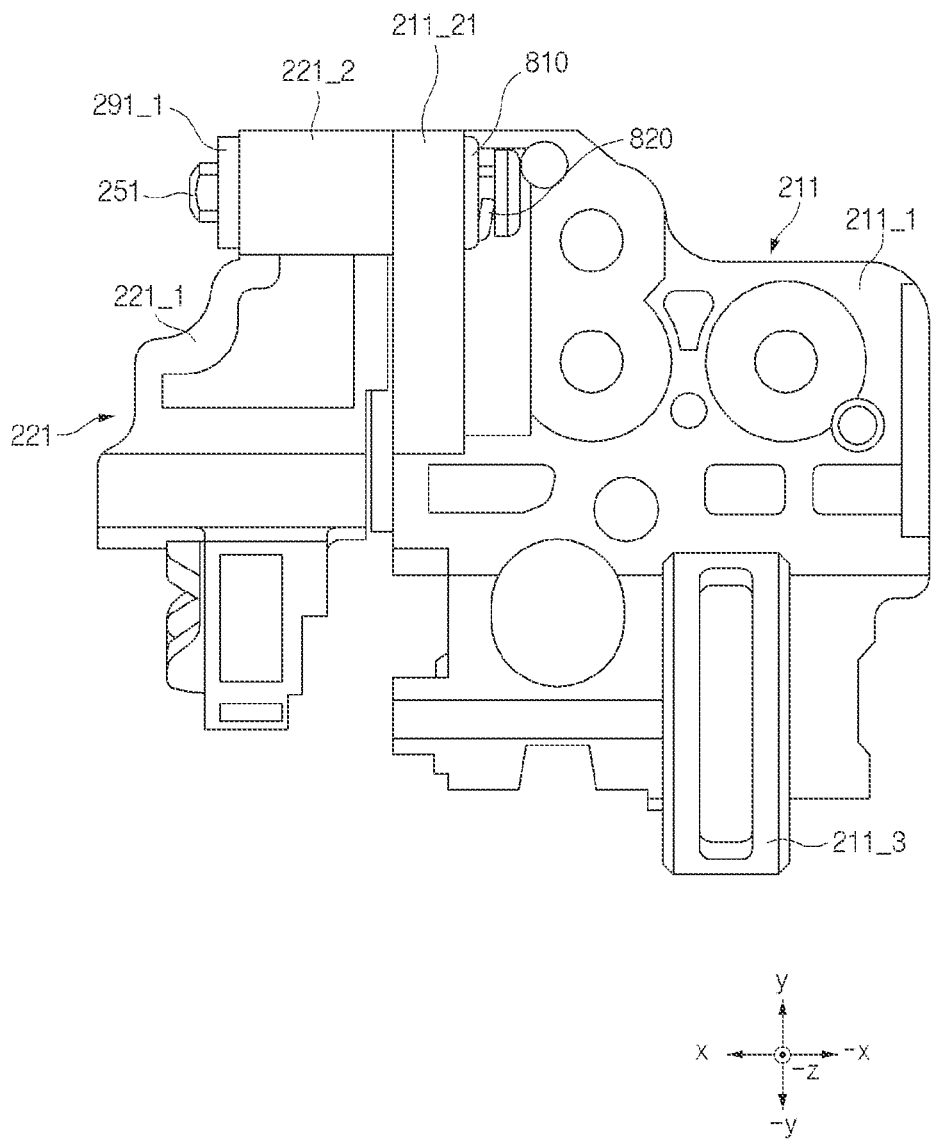
FIG. 8 is a diagram illustrating an example of various configurations of an example hinge structure related to a fixing structure of a first fixing pin according to various embodiments.
Figure 9:
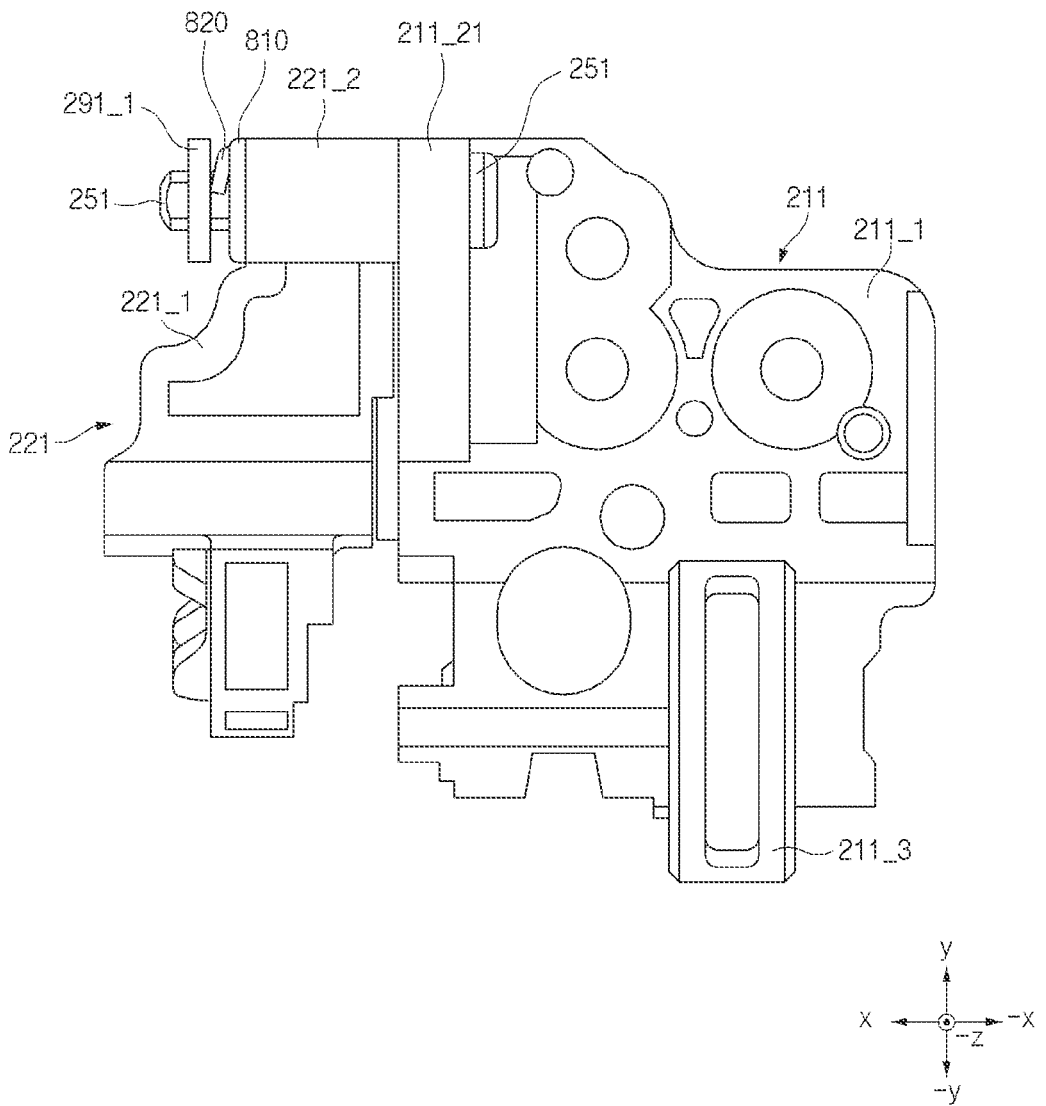
FIG. 9 is a diagram illustrating an example of various configurations of an electronic device related to a fixing structure of a first fixing pin according to various embodiments.

FIG. 8 is a diagram illustrating an example of some configurations of the hinge structure related to the fixing structure of the first fixing pin according to various embodiments. FIG. 9 is a diagram illustrating another example of some configurations of the electronic device related to the fixing structure of the first fixing pin according to various embodiments.

Referring to FIGS. 5 to 8, the hinge structure according to an embodiment may include at least the first rotation part 211, the first arm part 221, the first fixing pin 251, the first fixing clip 291_1 (or an E-ring), a washer ring 810, and an elastic member 820. In the hinge structure according to an embodiment, the washer ring 810 and the elastic member 820 may be disposed between the first rotation part 211 and one side (e.g., a cover in the −x axis direction) of the first fixing pin 251.

The first rotation part 211 may include a configuration that is the same as or similar to the configuration of the first rotation part 211, which is described above in FIGS. 3 to 7. For example, the first rotation part 211 may include the first bracket body 211_1, the first sliding part 211_21 that is formed to protrude from one side of the first bracket body 2111 in the −z axis direction and is used for connection to the first arm part 221, and the first rail 211_3. According to an embodiment, the first sliding part 211_21, as described above in FIGS. 5 to 7, may include the first sliding/holding part 211_21a including a portion of a bottom surface having a specific inclination angle (e.g., an angle that is larger than 0 degrees or smaller than 90 degrees), and the second sliding/holding part 211_21b including a bottom surface that is at least partially flat with respect to the x axis direction. According to various embodiments, in a state, in which the washer ring 810 and the elastic member 820 are applied to the first fixing pin 251, the first sliding part 211_21 may include only the second sliding/holding part 211_21b including only a flat bottom surface.

The first arm part 221 may include a configuration that is the same as or similar to the configuration of the first arm part 221, which is described above in FIGS. 3 to 7. For example, the first arm part 221 may at least include the first basic body 221_1 and the first connection part 221_2. The first connection part 221_2 may be disposed at a y axis periphery of the first basic body 2211 and may be formed to protrude in the −z axis direction. The first connection part 221_2, as described above in FIGS. 5 to 7, may include the first protrusion 221_2b that protrudes while having a specific curvature in the −x axis direction. At least a portion of the first protrusion 221_2b may be held on one side (e.g., the first sliding/holding part 211_21a) of the first sliding part 211_21. According to various embodiments, the first connection part 221_2 of the first arm part 221 of FIG. 8 may have a structure, in which the separate protrusion shape is removed. In this case, a surface of the first connection part 221_2 in the −x axis direction may face a surface of the first sliding part 21121 in the x axis direction in parallel or may contact it while being parallel thereto.

At least a portion of the first fixing pin 251 may be disposed to pass through at least a portion of the first slide hole 211_2 formed in the first sliding part 211_21 in the x axis direction in the −x axis. The first fixing pin 251 may have a cover, of which an end in the −x axis is larger than a center thereof, a central portion of the first fixing pin 251 includes a column shape that extends in the x axis direction from the center of the cover, and a band groove, into which the first fixing clip 2911 is inserted, may be formed at an end of the column shape in the x axis direction. A length of the first fixing pin 251, for example, may have a length that is larger than a width (or a width in the −x axis direction) of the first sliding part 211_21 of the first rotation part 211 in the x axis direction, a width (or a width in the −x axis direction) of the first connection part 221_2 of the first arm part 221 in the x axis direction, and a thickness of the first fixing clip 291_1. Additionally, the washer ring 810 and the elastic member 820 may be disposed between the cover of the first fixing pin 251 and a surface of the first sliding part 211_21 in the −x axis direction. The elastic member 820 may exert an elastic force while increasing a contact strength of the washer ring 810 and one surface (e.g., a surface in the −x axis direction) of the first sliding part 21121.

The first fixing clip 2911 may be inserted into the band groove formed at one end (e.g., an end in the x axis direction) of the first fixing pin 251 to function to fix the first fixing pin 251 to the first arm part 221 such that the first fixing pin 251 is prevented from being separated in the −x axis direction. At least a portion of the first fixing clip 291_1 may be formed of a metallic material, and an entire shape thereof, for example, may be an E-ring or C-ring shape.

The washer ring 810 may be disposed between the first sliding part 211_21 and the elastic member 820. One side of the washer ring 810 may be disposed to contact one surface of the first sliding part 211_21, and an opposite side thereof may be disposed to contact the elastic member 820. The washer ring 810 may function to prevent wearing of one side of the first sliding part 211_21 due to the elastic member 820 by preventing the elastic member 820 from directly contacting the first sliding part 211_21, and uniformly deliver the elastic force of the elastic member 820 to the first sliding part 211_21 through the washer ring 810. Furthermore, the washer ring 810 may alleviate a possibility of at least a portion of the elastic member 820 being separated toward the first slide hole 211_2 while the first fixing pin 251 is moved along the first slide hole 211_2 while being moved along the first slide hole 211_2 formed in the first sliding part 21121 or prevent separation thereof. According to various embodiments, the washer ring 810 may be omitted.

The elastic member 820 may be disposed between the washer ring 810 and the cover of the first fixing pin 251 to exert an elastic force in the x axis or −x axis direction. Because the one end of the first fixing pin 251 is fixed by the first fixing clip 291_1, the elastic force of the elastic member 820 may support the first fixing pin 251 and restrain movement of the first fixing pin 251 such that the first fixing pin 251 is disposed between the first rotation part 211 and the first arm part 221 more firmly. According to various embodiments, when the washer ring 810 is omitted, the elastic member 820 may be disposed between one surface of the first sliding part 211_21 and the cover of the first fixing pin 251 to function to pull the first fixing pin 251 in the −x axis direction while contacting the one surface of the first sliding part 211_21. Accordingly, movement of the first fixing pin 251 in the first slide hole 211_2 in the first sliding part

211_21 and the first connection hole 221_2a of the first connection part 221_2 may be prevented (or reduced). According to various embodiments, it is illustrated that the illustrated elastic member 820 has a spring shape, but the disclosure is not limited thereto. For example, the elastic member 820 may have a leaf spring shape having a hole of a size, by which a column of the first fixing pin 251 may pass through a center thereof.

Referring to FIGS. 5 to 9, a hinge structure according to an embodiment may include at least the first rotation part 211 and the first arm part 221, the first fixing pin 251, the first fixing clip 291_1 (or an E-ring), the washer ring 810, and the elastic member 820, and may have the same structure, except that the locations of the washer ring 810 and the elastic member 820 are different from those of the washer ring and the elastic member described in FIG. 8.

According to an embodiment, the washer ring 810 may be disposed between the first fixing clip 2911 and one surface (e.g., one surface in the x axis direction) of the first sliding part 211_21. The elastic member 820 may be disposed between one end (e.g., a peripheral end in the x axis direction) of the first fixing pin 251 and one surface (e.g., one surface in the x axis direction) of the first sliding part 211_21. Alternatively, the elastic member 820 may be disposed between the first fixing clip 291_1 and the washer ring 810 (or the first sliding part 211_21). The elastic member 820 may be supported by the washer ring 810 that contacts one surface (e.g., one surface in the x axis direction) of the first sliding part 211_21, and may exert an elastic force in the x axis direction to fix the first fixing pin 251 inside the first arm part 221 and the first rotation part 211 more firmly.

According to various embodiments, in the hinge structure of the electronic device 100, the washer ring 810 and the elastic member 820 applied to the first fixing pin 251 also may be applied to the second fixing pin 252 in the same way.

Figure 10:
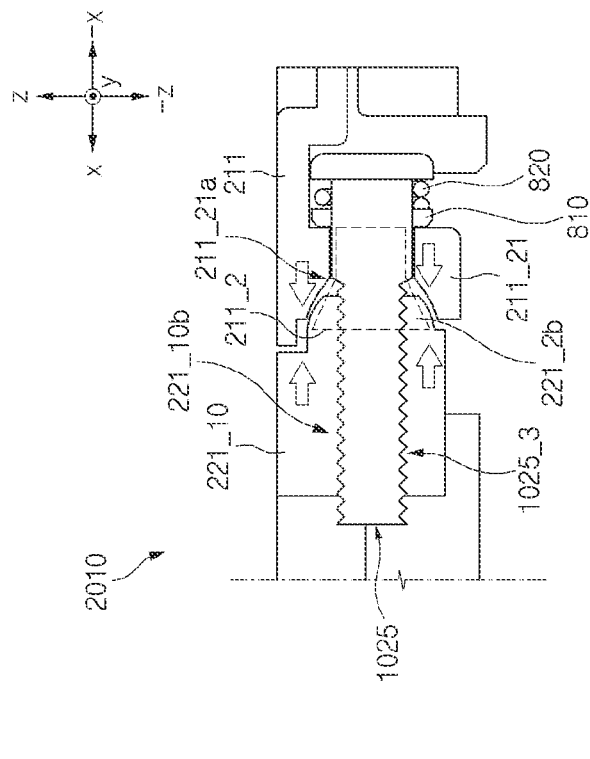
FIG. 10 is a diagram illustrating an example of a hinge structure according to various embodiments.
Figure 10:
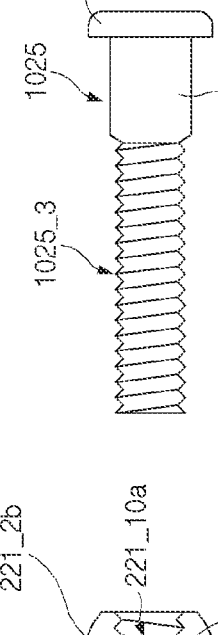
Figure 10:
Figure 10:
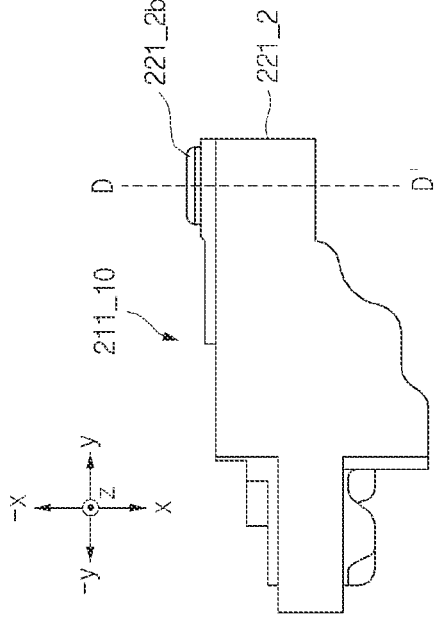
Figure 10:
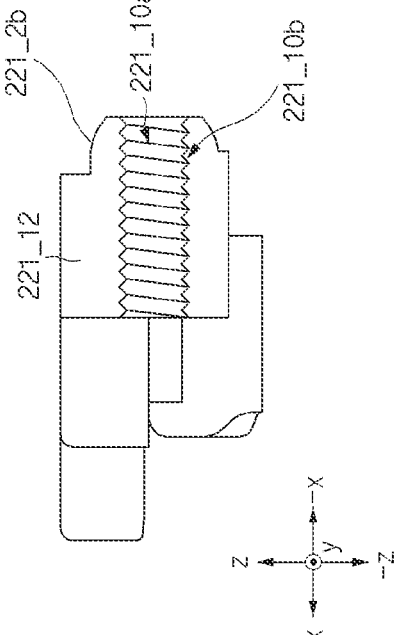

FIG. 10 is a diagram illustrating a hinge structure according to various embodiments.

Referring to FIG. 10, a modified hinge structure 2010 according to an embodiment may include at least a first modified arm part 22110 and the first rotation part 211.

The first modified arm part 221_10 may at least include the first basic body 221_1 and a first modified connection part 221_12. The first basic body 221_1 may have a structure that is the same as or similar to that of the basic body of the first arm part 221, which has been described above in FIG. 4 or FIG. 5.

The first modified connection part 221_12 may include a modified connection hole 221_10a and the protrusion 221_2b. The protrusion 221_2b may have a structure that is the same as or similar to that of the first protrusion 221_2b described above in FIG. 4 or FIG. 5.

The modified connection hole 221_10a may have a female screw thread 221_10b (or a female screw thread pattern) on an inner side thereof. A size of the modified connection hole 221_10a may be a size that is the same as a diameter of a cross-section of one side (e.g., the column part) of a modified fixing pin 1025. The female screw thread 221_10b formed in the modified connection hole 221_10a may be formed to be engaged with a male screw thread 10253 (or a male screw thread pattern) formed on one side of the modified fixing pin 1025.

The modified fixing pin 1025 may include a cover 1025_1 having a specific thickness and having a circular or polygonal shape, a column part 1025_2 that extends from a central portion of the cover 1025_1 in one direction, and the male screw thread 1025_3 formed on an outer surface of the column part. A width of the male screw thread 10253 may be larger than a depth (e.g., a length in the x axis direction) of the modified connection hole 221_10a. According to various embodiments, the width of the modified fixing pin 1025 having the male screw thread 10253 may be smaller than the depth of the modified connection hole 221_10a. Furthermore, in relation to easiness of coupling of the modified fixing pin 1025 and the modified connection hole 221_10a, a recess (e.g., a straight pattern, a cross pattern, a triangular recess, or a rectangular recess) of a specific pattern may be formed at a central portion (e.g., a central portion of an opposite side surface to a part, in which the column part 1025_2) of the cover 1025_1.

While the protrusion 221_2b of the first modified arm part 22110 is held at a portion (e.g., the first sliding/holding part 211_21a) of the first sliding part 211_21, at least a portion of the modified fixing pin 1025 may pass through the first slide hole 211_2 and be inserted into the modified connection hole 221_10a of the first modified arm part 22110. For example, at least a portion of the column part 1025_2 having the male screw thread 1025_3 of the modified fixing pin 1025 may be screw-coupled to a pattern of the female screw thread 221_10b of the modified connection hole 221_10a. In this state, the washer ring 810 and the elastic member 820 may be disposed between the first rotation part 211 and the modified fixing pin 1025 (or between the first sliding part 211_21 and the cover 1025_1 of the modified fixing pin 1025). The elastic member 820 may help the first modified arm part 221_10 and the first rotation part 211 be coupled to each other more firmly by exerting an elastic force to pull the modified fixing pin 1025 in the −x axis direction. According to various embodiments, at least one of the washer ring and the elastic member, which have been described above, may be omitted.

According to various embodiments, the above-described first modified arm part 221_10 may be applied to at least one of the hinge structures described above in FIGS. 1 to 9, respectively or at the same time. For example, at least one of the arm parts of the first hinge structure 200a and the arm parts of the second hinge structure 200b may include the first modified arm part 221_10 and the modified fixing pin 1025.

Figure 11:
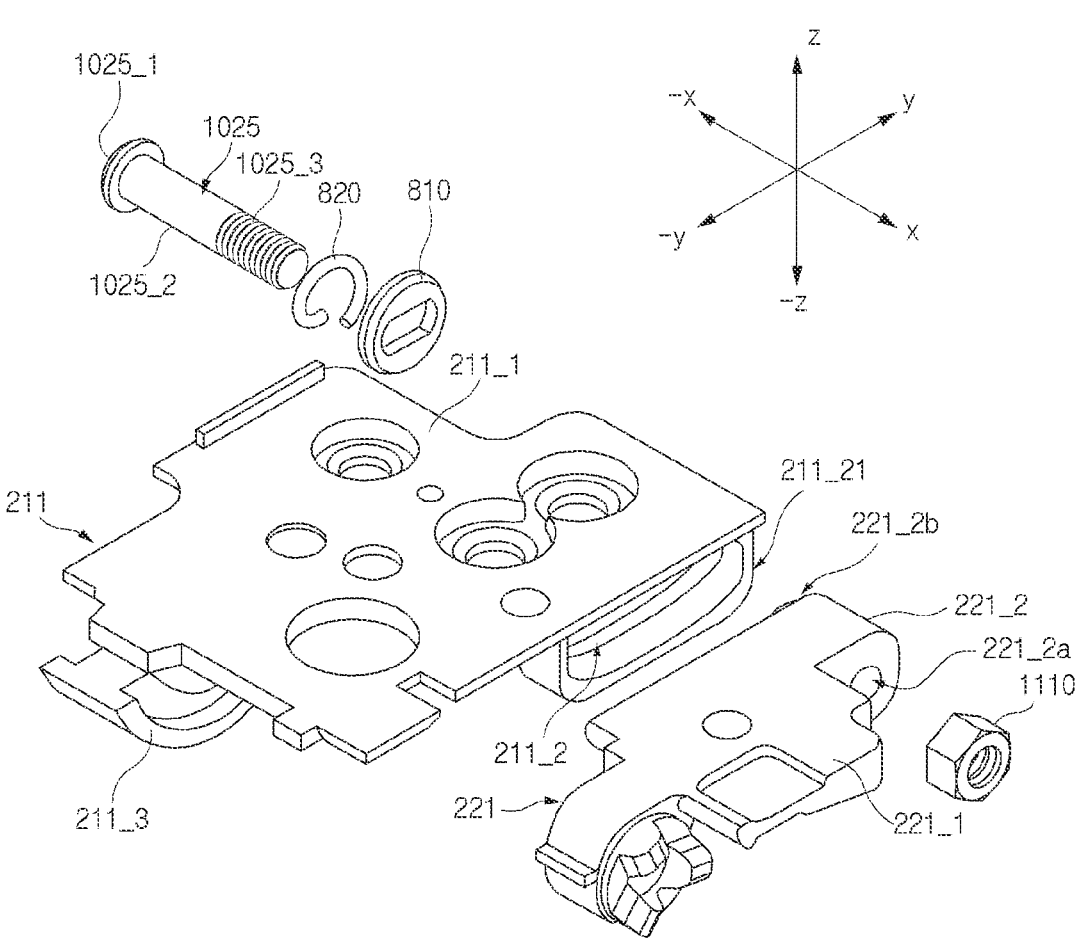
FIG. 11 is a diagram illustrating an example including an additional structure related to fixing of a first modified arm part and a fixing pin according to various embodiments.

FIG. 11 is a diagram illustrating an example including an additional structure related to fixing of the first modified arm part and the modified fixing pin according to various embodiments.

Referring to FIGS. 3 to 11, a modified hinge structure 2011 according to an embodiment may include at least the first rotation part 211, the first arm part 221, the modified fixing pin 1025, the washer ring 810, the elastic member 820, and a pin fixing part 1110.

The first rotation part 211 may include a structure that is the same as or similar to that of the first rotation part 211, which is described above in FIGS. 1 to 10. For example, the first rotation part 211 may include at least the first bracket body 211_1, the first sliding part 211_21, the first slide hole 211_2, and the first rail 211_3. At least a portion of the first sliding part 211_21 may be disposed to face one side (e.g., the first connection part 221_2) of the first arm part 221. As described above in FIG. 6, the first sliding part 21121 may include the first slide hole 211_2 in a slot form, in which it passes in the x axis or −x axis direction and is formed long in the y axis or −y axis direction. At least a portion of the modified fixing pin 1025 may be disposed to pass through the first slide hole 211_2.

The first arm part 221 may include a structure that is the same as or similar to the structure of the first arm part 221, which is described above in FIGS. 1 to 9. For example, the first arm part 221 may at least include the first basic body 221_1 and the first connection part 221_2. The first connection hole 221_2a that passes in the x axis or –x axis direction may be formed at a central portion of the first connection part 2212, and the first protrusion 221_2b that protrudes in the –x axis direction may be disposed on one surface of the first connection part 221_2 in the –x axis direction. The first connection hole 221_2a and the first protrusion 221_2b may have structures that are the same as or similar to those of the first connection hole 221_2a and the first protrusion 221_2b, which have been described above in FIGS. 5 to 7. For example, at least a portion of the first protrusion 221_2b may be disposed to contact one side of the first sliding part 211_21, and may be moved along the first slide hole 211_2 (or the first holding recess) of the first sliding part 211_21 in correspondence to a folding or unfolding operation of the electronic device 100. In the movement process, the first protrusion 221_2b may restrain movement of the first arm part 221 as it is maintained in a contact state with the first sliding part 211_21 (e.g., the first sliding/holding part 211_21a). A size of a cross-section of the first connection hole 221_2a in the z axis direction may be formed to be the same as or similar to (or smaller than a size of a cross-section of the modified fixing pin 1025 in the z axis direction) a size of a cross-section of the modified fixing pin 1025 in the z axis direction. At least a portion of the modified fixing pin 1025 may be disposed to pass through the first connection hole 221_2a. According to various embodiments, a female screw thread pattern may be formed at at least a portion of an inner wall of the first connection hole 221_2a.

The modified fixing pin 1025, for example, may include the cover 10251 having a specific thickness and having a circular shape, the column part 10252 having a specific thickness in the x axis direction from a central portion of the cover 10251, and the male screw thread 1025_3 formed on an outer side of one end of the column part 1025_2. A size of a cross-section of the cover 1025_1 in the z axis direction may be formed to be larger than a size (a size of a portion of a cross-section in the z axis direction at a location, at which the modified fixing pin 1025 is held) of one side of a cross-section of the first slide hole 211_2 in the z axis direction. Alternatively, a size of a cross-section of the cover 1025_1 in the z axis direction may be formed to be larger than a size of a cross-section of the column part 1025_2 in the z axis direction. For example, a diameter or height of the cover 1025_1 in the z axis direction may be formed to be larger than a height of the first slide hole 211_2 in the z axis direction. At least a portion of an area of the modified fixing pin 1025, in which the male screw thread 1025_3 is formed, may be disposed to pass through the first connection hole 221_2a and deviate from the first connection hole 221_2a, and protrude further in the x axis direction from one surface of the first connection part 221_2 in the x axis direction.

The washer ring 810 and the elastic member 820 may be inserted onto the modified fixing pin 1025. The modified fixing pin 1025 may pass through the first slide hole 211_2 of the first rotation part 211, and pass through the first connection hole 221_2a whereby an area, in which the male screw thread 1025_3 is formed, may deviate from the first connection hole 221_2a to protrude. The pin fixing part 1110 (e.g., a nut) may be coupled to one area of the modified fixing pin 1025, in which the male screw thread 1025_3 is formed. A hole of a specific size, by which the modified fixing pin 1025 is inserted, may be formed at a center of the washer ring 810. An entire size of the washer ring 810 may be formed to be larger than a size of one side of the first slide hole 211_2. For example, a diameter of the washer ring 810 may be formed to be larger than a height of the first slide hole 211_2 in the z axis direction. According to various embodiments, a length of a width of the male screw thread of the modified fixing pin 1025 of FIG. 12 may be formed to be larger than a length of a width of the male screw thread of the modified fixing pin 1025 described in FIG. 11.

According to the modified hinge structure of the above-described structure, insertion locations of the first slide hole 211_2 and the first connection hole 221_2a of the modified fixing pin 1025 may be adjusted by adjusting an assembling state of the pin fixing part 1110 and the modified fixing pin 1025. For example, according to the assembling state of the pin fixing part 1110 and the modified fixing pin 1025, a compression degree of the elastic member 820 disposed in the modified fixing pin 1025 may be changed. According to an embodiment, according to a protrusion length of the modified fixing pin 1025 that protrudes in the x axis direction of the pin fixing part 1110, an interval between the pin fixing part 1110 and the cover 1025_1 of the modified fixing pin 1025 may become smaller, and thus, the compression degree of the elastic member 820 may become higher. The hinge structure according to an embodiment may restrain movement of the modified fixing pin 1025 more firmly by fixing the modified fixing pin 1025 more firmly with the pin fixing part 1110 and adjusting the compression degree of the elastic member 820 as well.

Figure 12:
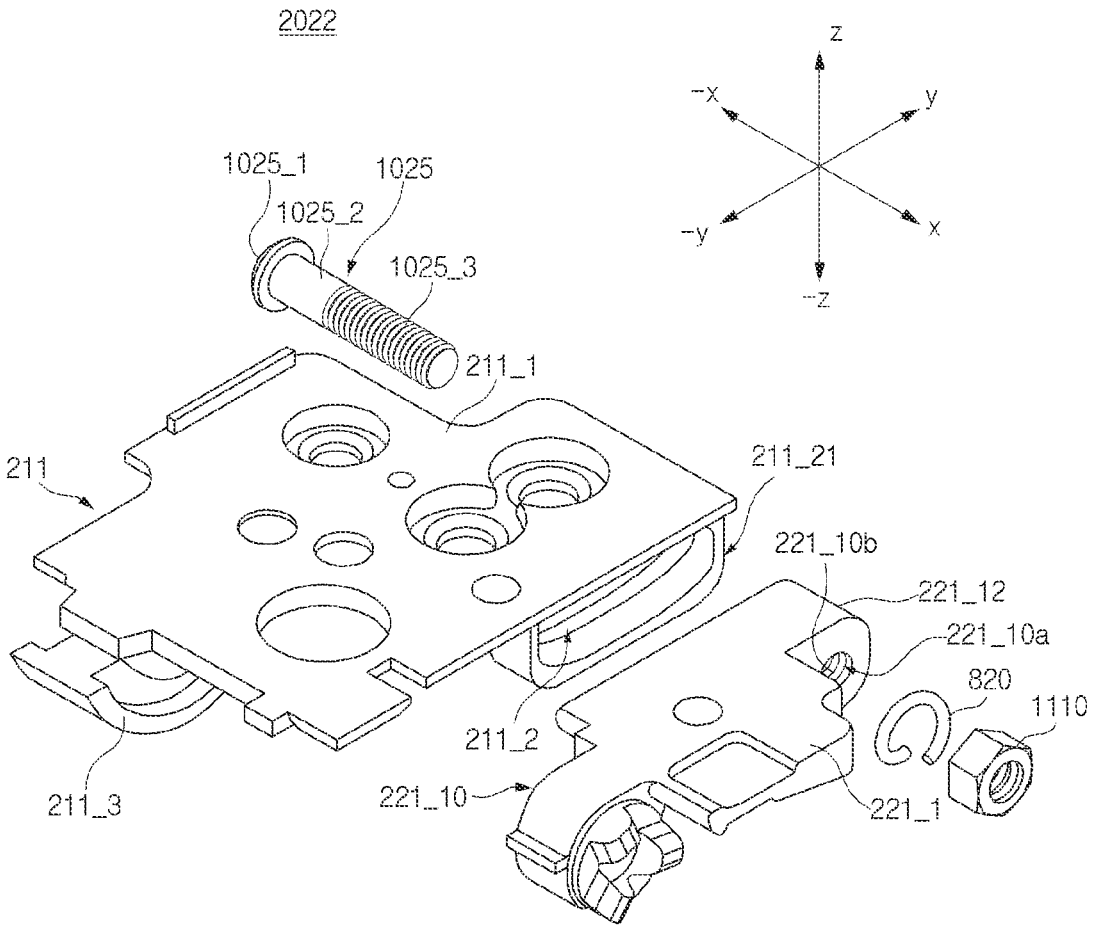
FIG. 12 is a diagram illustrating an example including an additional structure related to fixing of a first modified arm part and a fixing pin according to various embodiments.

FIG. 12 is a diagram illustrating another example including an additional structure related to fixing of the first modified arm part and the modified fixing pin according to various embodiments.

Referring to FIGS. 3 to 12, a modified hinge structure 2022 according to an embodiment may include at least the first rotation part 211, the first modified arm part 221_10, the modified fixing pin 1025, the elastic member 820, and the pin fixing part 1110.

The first rotation part 211 may have a structure that is the same as or similar to the configuration of the first rotation part 211, which is described above in FIG. 11. For example, the first rotation part 211 may include at least the first bracket body 211_1, the first sliding part 211_21, the first slide hole 211_2, and the first rail 211_3. At least a portion of the modified fixing pin 1025 may be disposed to pass through the first slide hole 211_2.

The first modified arm part 221_10 may include a configuration that is the same as or similar to the first modified arm part 221_10 described above in FIG. 10. For example, the first modified arm part 22110 may at least include the first basic body 2211 and the first modified connection part 221_12. The first modified connection part 22112 may include the modified connection hole 221_10a, and the female screw thread 221_10b may be formed on an inner side of the modified connection hole 221_10a. The female screw thread 221_10b formed on an inner side of the modified connection hole 221_10a may be coupled to the male screw thread 1025_3 of the modified fixing pin 1025.

The modified fixing pin 1025 may include the cover 10251, the column part 1025_2 that extends from a center of the cover 1025_1 in the x axis direction, and the male screw thread 1025_3 formed at at least a portion of an outer side of the column part 10252. A size (or a length of a pattern) of a pattern of the male screw thread 1025_3 of the modified fixing pin 1025 described in FIG. 12 may be formed to be larger than a size (or a length of the pattern) of the pattern of the male screw thread of the modified fixing pin 1025 described in FIG. 11. According to an embodiment, at least a portion of an area of the modified fixing pin 1025, in which the male screw thread 1025_3 is not formed, may be located in the first slide hole 211_2, at portion of an area thereof, in which the male screw thread 1025_3 is formed, may be located in the modified connection hole 221_10*a* of the first modified arm part 221_10, and the remaining portions of the area thereof, in which the male screw thread 1025_3 is formed, may pass through the modified connection hole 221_10*a* to protrude in the x axis direction. The remaining portions of the modified fixing pin 1025, which pass through the modified connection hole 221_10*a* to protrude in the x axis direction may be coupled to the pin fixing part 1110 (or a nut). According to various embodiments, the elastic member 820 may be disposed between the first modified connection part 221_12 and the pin fixing part 1110. The elastic member 820 may contact one side of the first modified connection part 221_12 to exert an elastic force that pushes out the pin fixing part 1110 in the x axis direction. Accordingly, according to a coupling location of the pin fixing part 1110 and the modified fixing pin 1025, a compression degree of the elastic member 820 may be changed, and thus a magnitude of the elastic force may be changed. According to various embodiments, a washer ring may be further disposed between the first modified connection part 221_12 and the elastic member 820.

Figure 13:
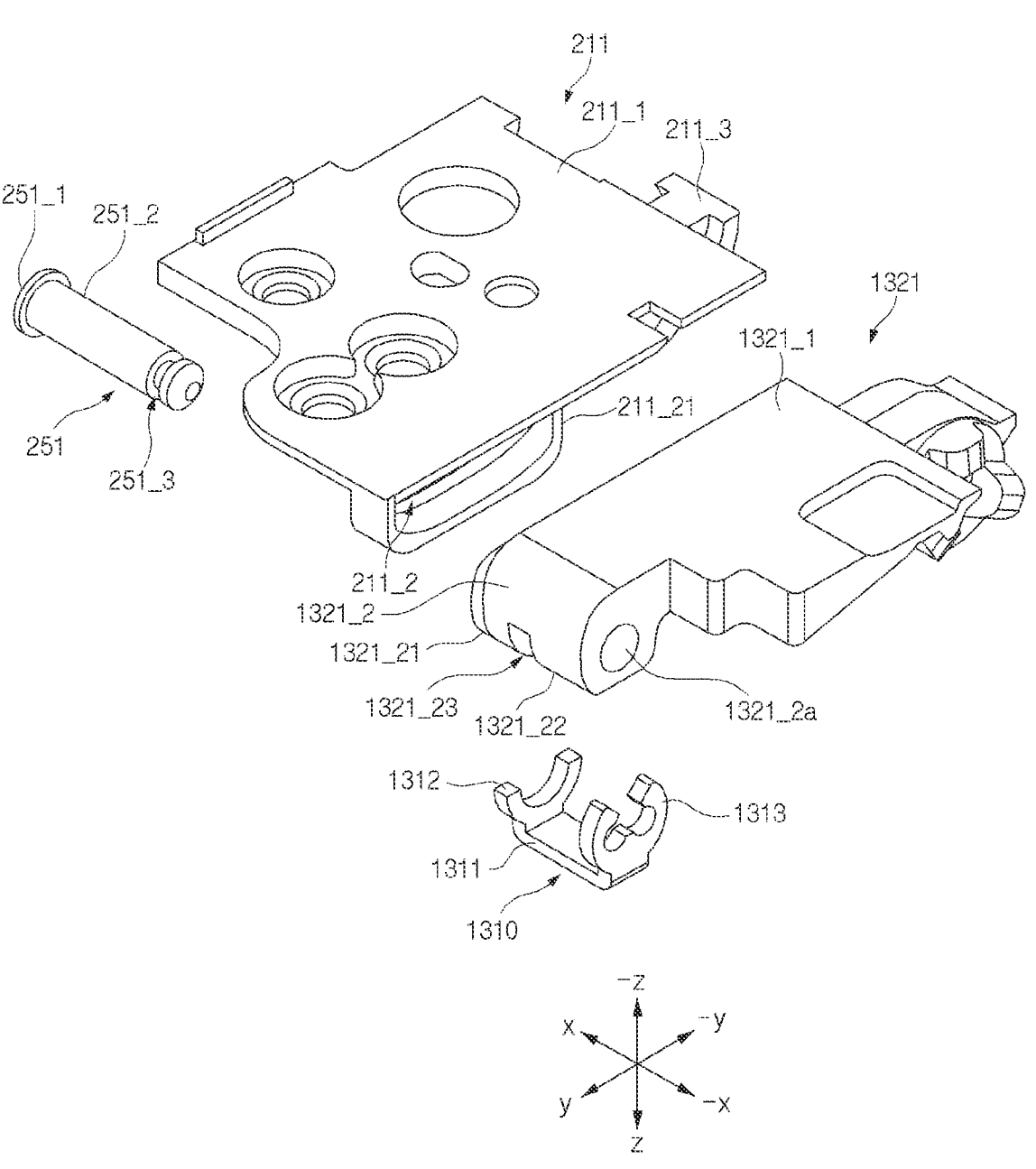
FIG. 13 is a perspective view illustrating an example of various configurations of a hinge structure having a second modified arm part according to various embodiments.
Figure 14:
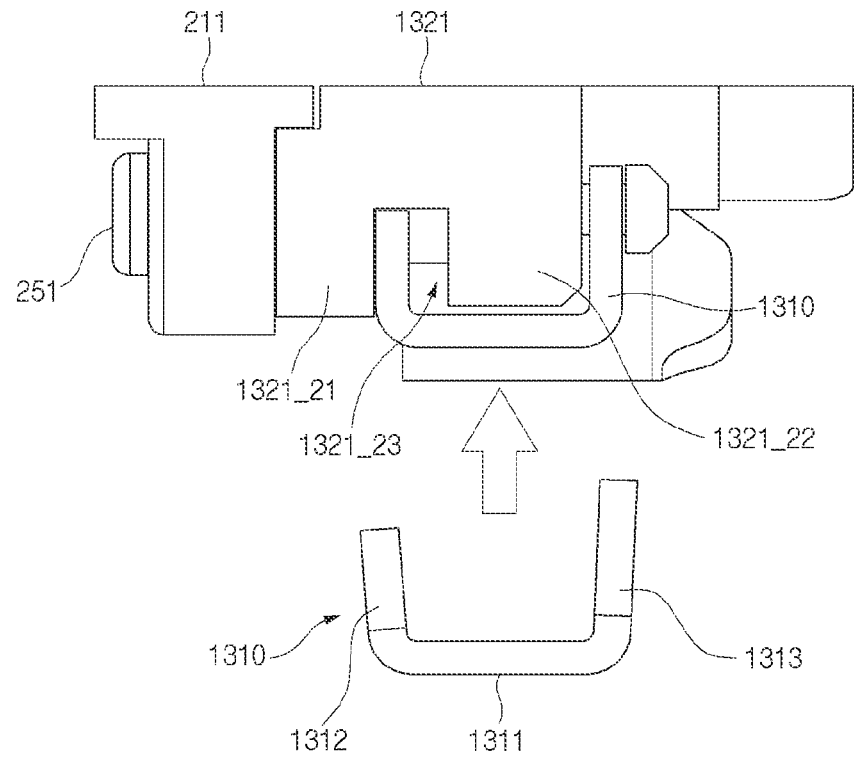
FIG. 14 is a diagram illustrating an example of a coupling state of an elastic member according to various embodiments.
Figure 15:
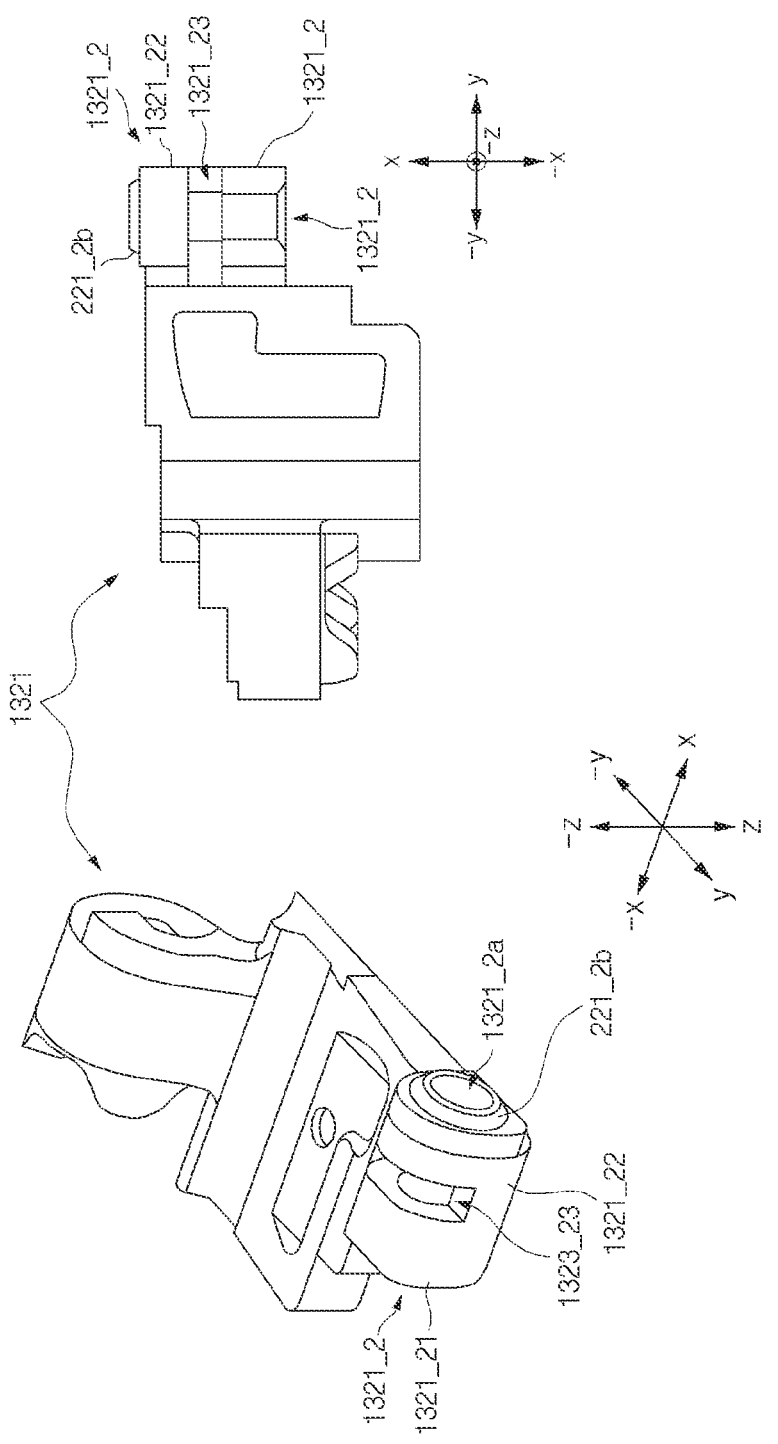
FIG. 15 is a diagram illustrating an example of a portion of an example second arm part according to various embodiments.

FIG. 13 is a perspective view illustrating an example of some configurations of a hinge structure having a second modified arm part according to various embodiments. FIG. 14 is a diagram illustrating an example of a coupling state of a modified elastic member according to various embodiments. FIG. 15 is a diagram illustrating an example of a portion of a second modified arm part according to various embodiments.

Referring to FIGS. 3 to 15, at least a portion of a hinge structure 2013 according to an embodiment may include at least the first rotation part 211, a first fixing pin 251, a second modified arm part 1321, and a modified elastic member 1310.

The first rotation part 211, for example, may include the first bracket body 211_1, the first sliding part 211_21, the first slide hole 2112, and the first rail 211_3. The first slide hole 2112 may include a slot that is disposed to pass in the x axis or –x axis direction and is long in the y axis direction. As described above in FIG. 5, shapes of an inlet part (or an outlet part) of the first slide hole 211_2 in the x axis direction, into which the first fixing pin 251 is inserted, and an outlet part (or an inlet part) thereof in the –x axis direction, which contacts at least a portion of the second modified arm part 1321, may be formed differently. For example, the shape of the outlet part in the –x axis direction may be formed to be larger than the shape of the inlet part thereof in the x axis direction.

The first fixing pin 251 may pass through at least a portion of the first slide hole 211_2 of the first rotation part 211 and may be inserted into a hole formed in the second modified arm part 1321. The first fixing pin 251, for example, may include a cover 251_1, a column part 251_2, and a band groove 251_3. The cover 251_1 may have a circular shape (or a polygonal shape), a diameter of which is a height that is larger than a height of the first slide hole 211_2 in the z axis direction. The column part 251_2 that extends in the –x axis direction may be disposed at a central portion of the cover 251_1, the first slide hole 211_2 may be located at a portion of the column part 2512, another portion thereof may be located in a hole (e.g., the hole 1321_2*a*) formed in the second modified arm part 1321, and the remaining portions thereof may pass through the hole of the second modified arm part 1321 to protrude to an outer side (e.g., the –x axis direction) of a second modified connection part 1321_2. At least a portion of the first fixing pin 251 that protrudes to an outer side of the second modified connection part 1321_2 may include the band groove 251_3. One side (e.g., a pin coupling part 1313) of the modified elastic member 1310 may be coupled to the band groove 251_3.

Referring to FIGS. 13 and 14, at least a portion of the modified elastic member 1310 may be formed of an elastic metallic material. The modified elastic member 1310 may be coupled to one side of the first fixing pin 251 while being coupled to the second modified connection part 1321_2. According to an embodiment, the modified elastic member 1310 may include a support part 1311, a holding part 1312, and the pin coupling part 1313. The support part 1311 may include a surface of a specific size that is parallel to the xy plane, and may have a rectangular panel shape having a specific thickness in the z axis direction. The holding part 1312 may be disposed to have a specific inclination (e.g., an inclination between an angle between an angle that is not less than 90 degrees in the z axis direction from one side of the support part 1311 and an angle (180 degrees) that is parallel to the x axis direction) to an upper side (e.g., the z axis direction) from one side (e.g., a periphery in the x axis direction) of the support part 1311 and in the x axis direction. At least a portion of the holding part 1312 may have a shape including a portion of a ring when viewed in the x axis direction. Alternatively, at least a portion of the holding part 1312 may have a "U" shaped or "V" shaped ring form including a groove that is opened in the z axis direction. The holding part 1312 may be inserted into and held in (or fixed to) a holding groove 1312_23 formed in the second modified arm part 1321.

The pin coupling part 1313 may be disposed to have a specific inclination (e.g., an inclination between an angle between an angle that is not less than 90 degrees in the z axis direction from an opposite side of the support part 1311 and the x axis direction) to an upper side (e.g., the z axis direction) from one side (e.g., a periphery in the x axis direction) of the support part 1311 and in the x axis direction. Accordingly, a direction, in which the holding part 1312 extends from a center (e.g., a center of a line that connects the x axis and the –x axis) of the support part 1311, and a direction, in which the pin coupling part 1313 extends, may be opposite to each other. According to an embodiment, a length (e.g., a length of the support part 1311 in the x axis direction) between a bottom end (e.g., a part connected to the support part 1311) of the holding part 1312 and a bottom end (e.g., a part connected to the support part 1311) of the pin coupling part 1313 may be smaller than a length between an upper end (e.g., a peripheral end of the holding part 1312 in the z axis direction) of the holding part 1312 and an upper end (a peripheral end of the pin coupling part 1313 in the z axis direction) of the pin coupling part 1313. At least a portion of the pin coupling part 1313 may have a shape including a portion of the ring when viewed in the –x axis direction (or the x axis direction). Alternatively, at least a portion of the pin coupling part 1313 may have a "W" shaped, "V" shaped, or "U" shaped ring form including a groove that is opened in the z axis direction. At least one boss that protrudes from an outskirt of the ring in the central direction may be disposed in the groove of the pin coupling part 1313. The coupling of the at least one boss of the pin coupling part 1313 to the band groove 251_3 of the first fixing pin 251 may contribute to stably maintaining the fixed state of the first fixing pin 251 and the pin coupling part 1313 more stably.

Referring to FIGS. 13 and 15, the second modified arm part 1321 may include at least a basic body 1321_1 and the second modified connection part 1321_2. Additionally or alternatively, the second modified arm part 1321 may include the protrusion 221_2b that protrudes in the x axis direction. The protrusion 221_2b may be seated on one side (e.g., the first sliding/holding part 211_21a) of the first sliding part 211_21 of the first rotation part 211. The second modified connection part 1321_2 may be disposed on one side (e.g., a y axis periphery) of the first basic body 13211 and may be formed to protrude in the −z axis direction. The second modified connection part 13212 may include a first connection part 1321_21 that is adjacent to the first sliding part 211_21 of the first rotation part 211, a second connection part 1321_22 that is formed at a location that is spaced apart from the first connection part 1321_21 by a specific interval, and a holding recess 1321_23 that is formed between the first connection part 1321_21 and the second connection part 1321_22. An upper end of the first connection part 1321_21 may be formed to include a portion of the basic body 1321_1, and an upper surface (e.g., a surface in the z axis direction) thereof may be formed to be flat and a corner (e.g., a periphery in the y axis direction) thereof may be rounded. The first connection part 1321_21 may have a ring shape having a specific thickness in the x axis direction as a whole. For example, a central portion (or a central portion in the −x axis direction) of the first connection part 1321_21 may have a hole that passes in the x axis direction or the −x axis direction. The holding part 1312 of the modified elastic member 1310 may be inserted into and held in the holding recess 1321_23. In this regard, a width of the holding recess 1321_23 may be a width that is similar to a width of the holding part 1312 in the x axis direction. Alternatively, a width of the holding recess 1321_23 may be the same as the width of the holding part 1312 in the x axis direction or be smaller by a specific size, and the holding part 1312 may be inserted into and fixed to the holding recess 1321_23 through interference-fitting. According to various embodiments, the width of the holding recess 1321_23 in the x axis direction may be larger than a width of the holding part 1312 in the x axis direction such that the holding part 1312 may be easily inserted thereinto. The second connection part 1321_22 may be disposed to be spaced apart from the first connection part 1321_21 with the holding recess 1321_23 being interposed therebetween. An upper side (a surface in the z axis direction) of the second connection part 1321_22 may be a part that extends on one side of the basic body 1321_1. The second connection part 1321_22 may have a shape that is the same as or similar to the first connection part 1321_21. For example, the second connection part 1321_22 may have a cylindrical shape having a specific width in the x axis direction. A central portion of the second connection part 1321_22 may include a hole that passes in the x axis or −x axis direction, and a space corresponding to the hole of the second connection part 1321_22 may be continuous to a space of the holding recess 1321_23 and a space corresponding to the hole of the first connection part 1321_21. Accordingly, at least a portion of the first fixing pin 251 may be held in the hole of the first connection part 1321_21, and a space 1321_2a that is continuous to the space of the holding recess 1321_23 and the second connection part 1321_22. A width of the second connection part 1321_22 may be similar to or the same as a width of the support part 1311 of the modified elastic member 1310.

Meanwhile, at least one of the first modified arm part 221_10, the second modified arm part 1321, the modified elastic member 1310, the first fixing pin 251, the elastic member 820, and the washer ring 810 according to the above-described various embodiments may be applied to the various embodiments described above in FIGS. 1 to 13 complexly or individually. For example, at least one of the washer ring 810 and the elastic member 820 may be disposed between the cover 251_1 of the first fixing pin 251, and the band groove 251_3. According to an embodiment, at least a portion of an inner hole area of the second modified arm part 1321, which has been described above in FIGS. 13 to 15, may have a female screw thread as in the first modified arm part 221_10, and in this case, the first fixing pin 251 may be replaced by the modified fixing pin 1025 and the modified fixing pin 1025 may be inserted into the second modified arm part 1321 having a female screw thread. According to various embodiments, when the modified fixing pin 1025 is applied, the pin fixing part 1110 corresponding to a nut may be coupled to an end that protrudes from one side (e.g., the second connection part 1321_22) of the second modified arm part 1321.

Furthermore, the disposition directions of the configurations of the above-described hinge structure have been described with reference to a specific location, but the disclosure is not limited thereto. For example, the disposition directions, locations, and forms of the hinge structure may be changed in a condition, in which they agree with the functional parts thereof. Furthermore, the disposition directions and locations of the configurations of the hinge structure may be defined differently according to a description of a change in the reference point or a connection relationship with peripheral structures.

Figure 16:
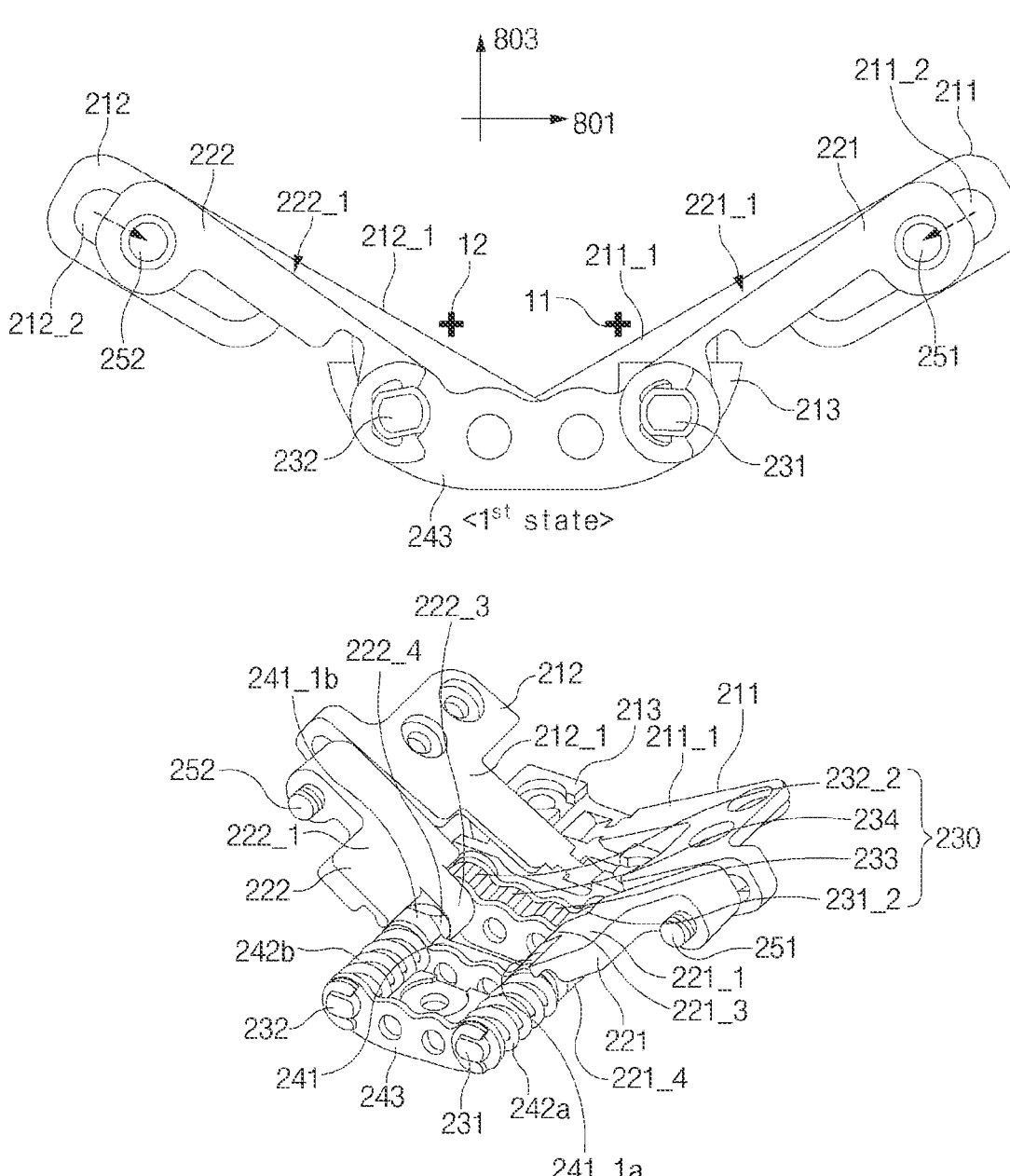
FIG. 16 is a diagram illustrating a first specific angle state of an example first hinge structure according to various embodiments.

FIG. 16 is a view illustrating a first specific angle state of the first hinge structure according to various embodiments.

Referring to FIGS. 1 to 16, the first hinge structure 200a may include a first specific angle state. The first hinge structure 200a may include the first rotation part 211, the second rotation part 212, the fixing bracket 213, the first arm part 221, the second arm part 222, a gear structure 230, the cam part 241, the first elastic body 242a, the second elastic body 242b, the first rotation member 231, the second rotation member 232, and the support bracket 243. The first rotation part 211 may be connected to the first arm part 221 through the first fixing pin 251. The second rotation part 212 may be connected to the second arm part 222 through the second fixing part 252.

As an external pressure is applied, the first housing (e.g., the first housing 110), to which the first rotation part 211 is fixed, and the second housing (e.g., the second housing 120 of FIG. 1), to which the second rotation part 212 is fixed, may be rotated from one point of a horizontal axis 801 by a specific angle in a direction of a vertical axis 803. For example, the first rotation part 211 connected to the first housing 110 may be rotated from one point of the horizontal axis 801 (e.g., the −y axis or −y axis of FIG. 4) by a first angle (e.g., 30 degrees) in a direction (e.g., a direction of the vertical axis 803 from a right side with reference to the illustrated drawing) of the vertical axis 803 (e.g., the z axis of FIG. 4) with reference to the first imaginary axis 11. When the first rotation part 211 is rotated by the first angle by the external pressure, the corresponding pressure may be delivered to the first arm part 221 through the first fixing pin 251. Accordingly, the first arm part 221 may be operated by the first angle in a direction of the vertical axis 803 on the horizontal axis 801 with respect to the first rotation member 231. In this operation, a force due to the rotation may be transmitted to the first rotary cam 221_4 and the first insertion part 221_3. The first rotation member 231, one side of which is inserted into the first insertion part 2213, may be rotated according to rotation of the first insertion part 2213, and accordingly, the first shaft gear 231_2 of the first rotation member 231 may be rotated while the first rotation member 231 is rotated. As the first shaft gear 231_2 is rotated, the first idle gear 233 and the second idle gear 234 that are geared with each other are rotated, and as a result, the second rotation member 232 may be rotated as the second shaft gear 232_2 is rotated. The second insertion part 222_3 may be rotated as the second rotation member 232 is rotated, the second arm part 222 may be rotated as the second insertion part 222_3 is rotated, and the second rotation part 212 connected through the second fixing part 252 may be rotated as the second arm part 222 is rotated.

As described above, the first hinge structure 200a may have a structure, in which the first rotation part 211 and the second rotation part 212 are rotated at the same time according to a pressure (or a force) applied from an outside. Accordingly, even when an external pressure is generated at the second housing 120, to which the second rotation part 212 is connected, or is generated in the first housing 110 and the second housing 120 at the same time, the first rotation part 211 and the second rotation part 212 may be rotated at the same time. The electronic device 100 of the disclosure may perform an accurate hinge operation while distortion of the first housing 110 and the second housing 120 is restrained as they are rotated at the same time.

According to various embodiments, as the first arm part 221 and the second arm part 222 are rotated by a specific first angle, the mountains of the first rotary cam 221_4 and the second rotary cam 2224 may be maintained in a state, in which they contact a vicinity of an apex of the mountain of a first fixing cam 241_1a and a vicinity of an apex of the mountain of a second fixing cam 241_4b.

According to an embodiment, the imaginary axes 11 and 12 of the first rotation part 211 and the second rotation part 212 are disposed between the first rotation member 231 and the second rotation member 232 of the first arm part 221 and the second arm part 222, and a rotation degree of the first rotation part 211 and a rotation degree of the first arm part 221 may be different. Accordingly, an upper surface of the first bracket body 211_1 of the first rotation part 211 may protrude further than an upper surface of the first basic body 221_1 of the first arm part 221 with respect to the horizontal axis 801. While the first rotation part 211 is rotated as the first rotation bracket and the first arm part 221 are connected to each other through the first fixing pin 251, the first fixing pin 251 may be slid by a specific distance along the first slide hole 211_2 of the first rotation part 211. Similarly, the upper surface of the second bracket body 2121 may be rotated to protrude further than the second basic body 222_1 with respect to the horizontal axis 801. Furthermore, while the second rotation part 212 is rotated as the second rotation bracket and the second arm part 222 are connected to each other through the second fixing part 252, the second fixing part 252 may be slid by a specific distance along the second slide hole 212_2 of the second rotation part 212. According to various embodiments, the first rotation part 211 and the second rotation part 212 may be maintained in a free stop state (a specific angle state, in which angles of the first rotation part 211 and the second rotation part 212 is larger than 0 degrees and smaller than 180 degrees, and a state that is maintained in a current state when an additional pressure is not applied) at an angle corresponding to the first state (or a state, in which the electronic device is formed at the first specific angle).

Figure 17:
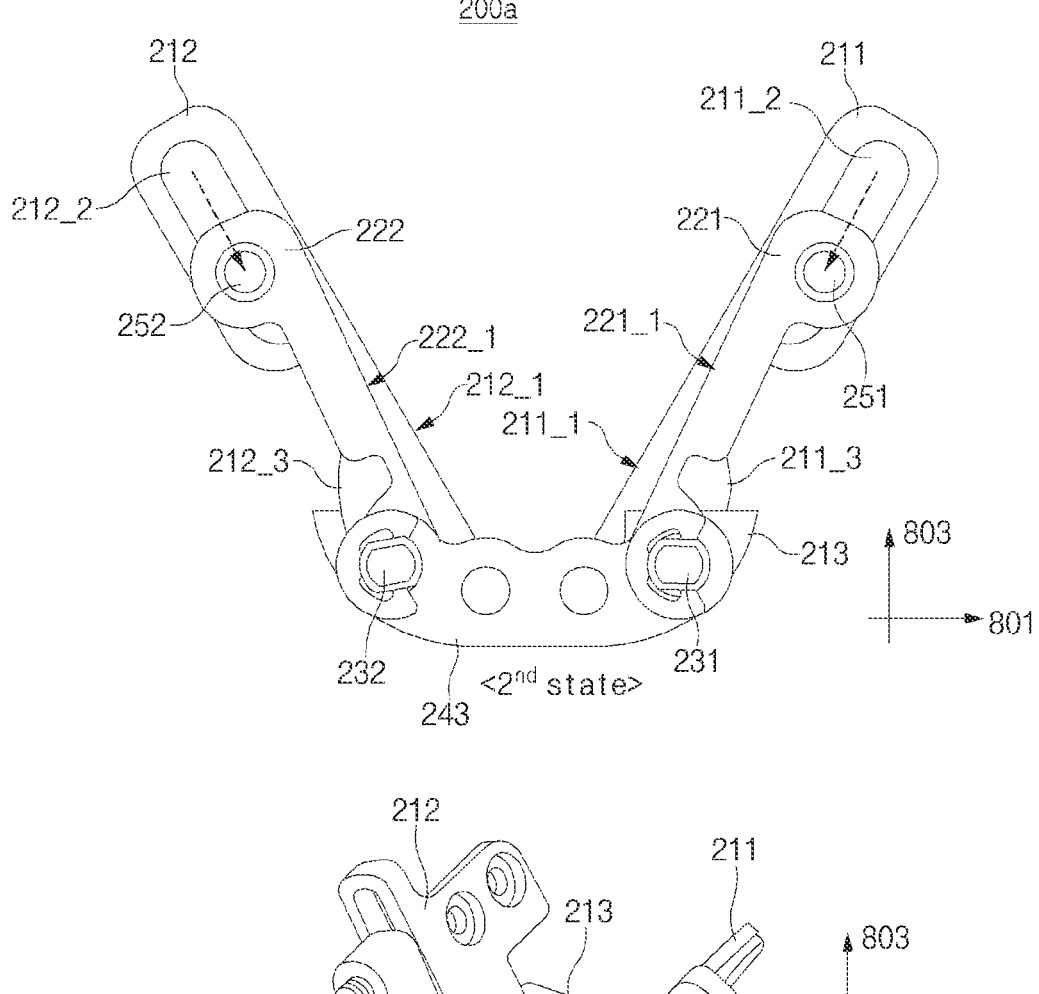
FIG. 17 is a diagram illustrating a second specific angle state of an example first hinge structure according to various embodiments.

FIG. 17 is a diagram illustrating a second state of the first hinge structure according to various embodiments.

Referring to FIGS. 1 to 17, the first hinge structure 200a may include a second state (or a second specific angle state).

The first hinge structure 200a, for example, may include the first rotation part 211, the second rotation part 212, the fixing bracket 213, the first arm part 221, the second arm part 222, the gear structure 230, the cam part 241, the first elastic body 242a, the second elastic body 242b, the first rotation member 231, the second rotation member 232, and the support bracket 243. The first rotation part 211 may be connected to the first arm part 221 through the first fixing pin 251, and the second rotation part 212 may be connected to the second arm part 222 through the second fixing part 252.

As an external pressure (or a force) is applied, the first housing (e.g., the first housing 110 of FIG. 1) or the second housing (e.g., the second housing 120 of FIG. 1) may be rotated from one point of the horizontal axis 801 by a second angle (e.g., 60 degrees) in a direction of the vertical axis 803 with reference to the illustrated drawings. For example, when an external pressure or a force is transmitted to the first housing 110 or the second housing 120, the first rotation part 211 or the second rotation part 212 may be rotated from one point of the horizontal axis 801 by a second angle (e.g., 60 degrees) in a direction (e.g., a direction of the vertical axis 803 from a right side with reference to the illustrated drawing) with respect to the first imaginary axis 11 or the second imaginary axis 12. In a process of performing the above-described operation, the applied force may be mutually transmitted through the first arm part 221 or the second arm part 222, the first rotation member 231 and the second rotation member 232, and the gear structures 230, and thus the first rotation part 211, the second rotation part 212, the first arm part 221, and the second arm part 222 may be rotated at the same time.

As the first rotation part 211 and the second rotation part 212 are rotated at the second angle, the first fixing pin 251 and the second fixing part 252 may be slid in the first slide hole 211_2 and the second slide hole 2122, and may be slid more in a direction of the fixing bracket 213 than in a state, in which they are rotated at the first angle. In the above-described operation process, the first rail 211_3 of the first rotation part 211 may be operated from a center of the fixing bracket 213 in a outwardly rightward direction with reference of the illustrated drawing, and the second rail 212_3 of the second rotation part 212 may be operated from a center of the fixing bracket 213 in an outwardly leftward direction. Because the axes, about which the first rotation part 211 and the first arm part 221 are rotated, are different and the axes, about which the second rotation part 212 and the second arm part 222 are rotated, are different, a distance between an upper surface of the first bracket body 211_1 and an upper surface of the second bracket body 212_1 may become shorter than a distance between an upper surface of the first basic body 2211 and an upper surface of the second basic body 222_1 as it goes in a direction of the fixing bracket 213. According to various embodiments, the first rotation part 211 and the second rotation part 212 may be maintained at an angle corresponding to a state, in which the electronic device is formed at the second specific angle and in a free stop state (e.g., a specific angle state (e.g., an angle between the first rotation part 211 and the second rotation part 212 is smaller than in the first state (or the first specific angle state) described in FIG. 16), in which the angle between the first rotation part 211 and the second rotation part 212 is larger than 0 degrees and smaller than 180 degrees) and a state, in which a current state is maintained when no additional pressure is applied).

Figure 18:
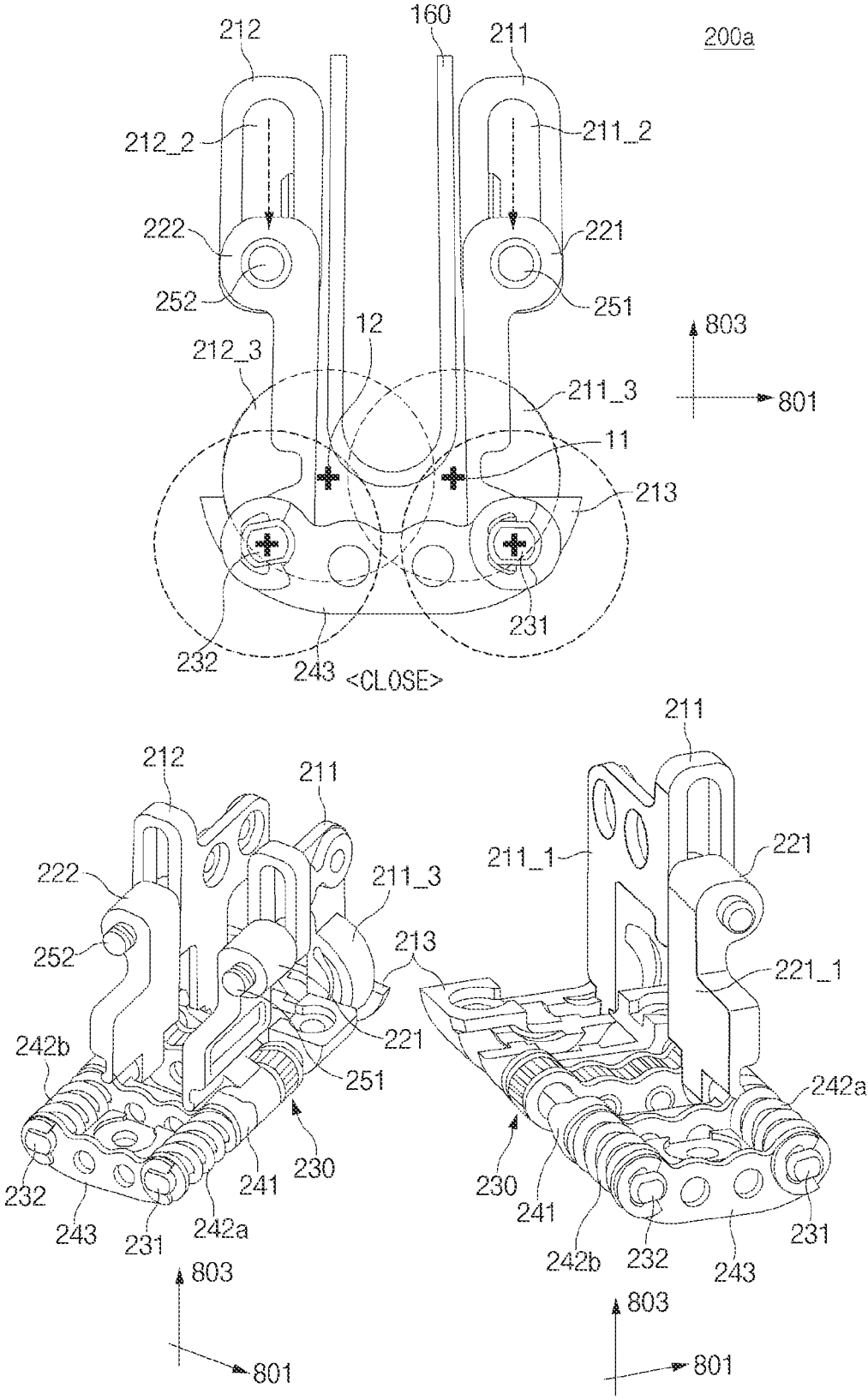
FIG. 18 is a diagram illustrating a folded state of various structures of an example electronic device according to various embodiments.

FIG. 18 is a diagram illustrating a folded state of some structures of the electronic device according to various embodiments.

Referring to FIGS. 1 and 18, the electronic device 100 may include the first hinge structure 200a and the display 160. The first hinge structure 200a may be disposed in a closed state or a folded state. The first hinge structure 200a, for example, may include the fixing bracket 213, the first rotation part 211, the second rotation part 212, the first arm part 221, the second arm part 222, the first fixing pin 251, the second fixing pin 252, the first rotation member 231, the second rotation member 232, the gear structure 230 including the shaft gears of the first rotation member 231 and the second rotation member 232, the first elastic body 242a, the second elastic body 242b, and the support bracket 243.

In the above-described structure, the first rotation part 211 and the second rotation part 212 may be disposed to face each other. With reference to the illustrated drawing, because the peripheral ends of the first housing 110 and the second housing 120 are disposed to be adjacent to each other, the first rotation part 211 may be rotated with respect to the first imaginary axis 11 and may be inclined leftwards further by a specific angle with respect to the vertical axis 803, in the illustrated drawing. Alternatively, the second rotation part 212 may be rotated with respect to the second imaginary axis 12, and may be disposed to be inclined rightwards further by a specific angle with respect to the vertical axis 803. The first imaginary axis 11, for example, may be a rotation center axis of the first rail 2113, and the second imaginary axis 12 may be a rotation center axis of the second rail 212_3. The first arm part 221 may be rotated with respect to the first rotation member 231 to be held in parallel to the first rotation part 211, and the second arm part 222 may be rotated with respect to the second rotation member 232 to be held in parallel to the second rotation part 212. Accordingly, a central portion of the display 160 may have a "U" shape, and the remaining portions thereof may be maintained in a flat state.

While the first rotation part 211 and the first arm part 221 are held vertically (or to be inclined by a specific angle leftwards with respect to the vertical axis 803), an upper surface of the first bracket body 211_1 of the first rotation part 211 and an upper surface of the first basic body 221_1 of the first arm part 221 may be disposed in parallel to each other with no height difference. Due to the difference between the lengths of the first rotation part 211 and the first arm part 211, the first fixing pin 251 may be located at a periphery of a lower side of the first slide hole 211_2 of the first rotation part 211. When the electronic device 100 is in the unfolded state, the first fixing pin 251 may be located at a periphery of an upper side of the first slide hole 211_2 of the first rotation part 211. Similarly, when the electronic device 100 is in the folded state, the second fixing part 252 may be located at a periphery of a lower side of the second slide hole 212_2.

The first rotation part 211 may be rotated in a rightward outward direction of the central portion of the fixing bracket 213 with reference to the illustrated drawing while the state of the electronic device 100 is changed from the unfolded state to the folded state, and may be rotated in a direction of the central portion from the rightward outward direction of the fixing bracket 213 with reference to the illustrated drawing while the state of the electronic device 100 is changed from the folded state to the unfolded state. According to an embodiment, the second rotation part 212 may be rotated in a leftward outward direction of the central portion of the fixing bracket 213 with reference to the illustrated drawing while the state of the electronic device 100 is changed from the unfolded state to the folded state, and may be rotated in a direction of the central portion from the leftward outward direction of the fixing bracket 213 with reference to the illustrated drawing while the state of the electronic device 100 is changed from the folded state to the unfolded state. While the electronic device 100 is maintained in the folded state, the mountain and the valley of the cam part 241 may be disposed to be engaged with the valleys and the mountains of the rotation cams disposed in the first arm part 221 and the second arm part 222. Accordingly, the first elastic body 242a and the second elastic body 242b may be restored to an initial state (e.g., a released state) from, among the first specific angle state and the second specific angle state, the compressed state.

Figure 19:
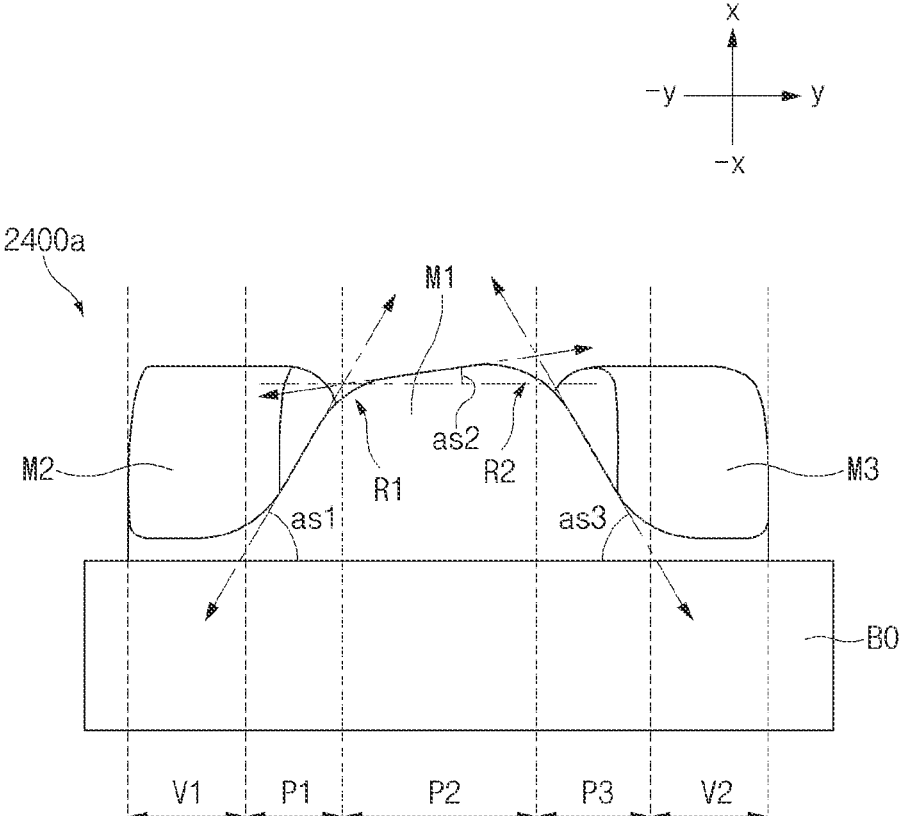
FIG. 19 is a diagram illustrating an example of a cam shape according to various embodiments.
Figure 20:
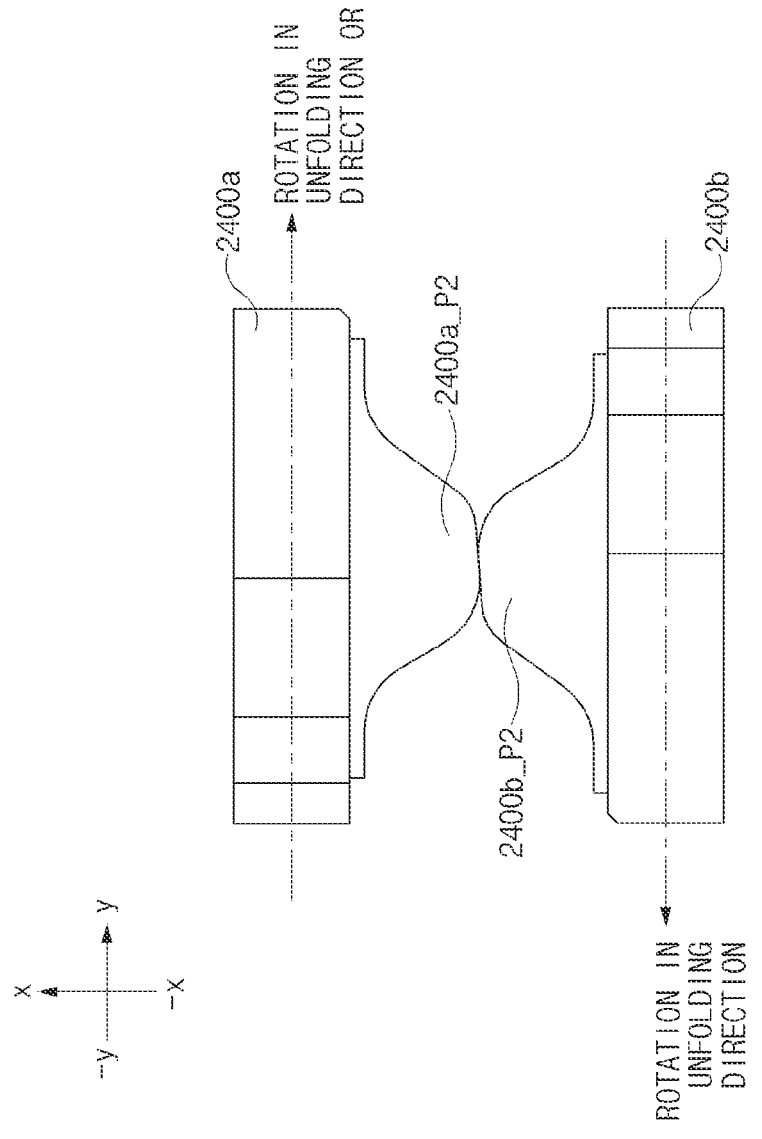
FIG. 20 is a diagram illustrating an example of a contact state of some mountains of an example cam and an example cam structure according to various embodiments.

FIG. 19 is a diagram illustrating an example of a cam shape according to various embodiments. FIG. 20 is a diagram illustrating an example of a contact state of some mountains of the cam and the cam structure according to various embodiments. Prior to a description, a cam 2400a according to an embodiment may be applied to at least one of the cam or the cam structure (e.g., the fixed cam or the rotation cam) described above in FIGS. 3 to 16.

Referring to FIG. 19, the cam 2400a (or the cam structure) according to an embodiment may include a cam support part B0, a plurality of mountains M1, M2, and M3, and a plurality of valleys V1 and V2. In the illustrated drawings, three mountains M1, M2, and M3 and three valleys V1 and V2 (the valley hidden by the first mountain M1 is not illustrated), but the disclosure is not limited thereto. For example, the cam 2400a may have a structure including two or more cams and valleys. All of the plurality of valleys M1, M2, and M3 may have the same structure. Alternatively, at least one of the plurality of mountains M1, M2, and M3 may have a shape that is different from those of the others. For example, the at least one mountain may have a structure, in which a second part P2 corresponding to a center of the mountain has a specific inclination angle (an inclination angle that is larger than 0 degrees, for example, around about 5 degrees) as illustrated, and the remaining at least one mountain may have a structure, in which a central portion of the mountain is flat.

According to an embodiment, at least one of the plurality of mountains M1, M2, and M3, for example, the first mountain M1, as illustrated, may include a first part P1 having a first inclination angle as1, the second part P2 having a second inclination angle as2, and a third part P3 having a third inclination angle as3. One side (e.g., an end in the −y axis direction) of the first part P1 may be continuous to one side (e.g., an end in the y axis direction) of the first valley V1, and an opposite side (e.g., an end in the y axis direction) of the first part P1 may be continuous to one side (e.g., an end in the −y axis direction) of the second part P2. The first part P1, for example, may have a ridge line having the first inclination angle as1 with respect to the y axis. The first inclination angle as1 may include an acute angle that is smaller than 90 degrees in the y axis direction from the −y axis with respect to the x axis.

One side (e.g., an end in the −y axis direction) of the second part P2 may be continuous to an opposite side (e.g., an end in the y axis direction) of the first part P1, and an opposite side (e.g., an end in the y axis direction) of the second part P2 may be continuous to one side (e.g., an end in the −y axis direction) of the third part P3. The second part P2 may be disposed to protrude further than the first part P1 and the third part P3 in the x axis direction. A border area of the first part P1 and the second part P2 may be rounded at a first curvature R1. The second part P2 may have the second inclination angle as2 with respect to the y axis. The second inclination angle as2 may include an acute angle that is smaller than 90 degrees in the y axis direction from the –y axis with respect to the x axis, and an absolute angle of the second inclination angle as2 may be smaller than an absolute value of the first inclination angle as1.

One side (e.g., an end in the –y axis direction) of the third part P3 may be continuous to an opposite side (e.g., an end in the y axis direction) of the second part P2, and an opposite side (e.g., an end in the y axis direction) of the third part P3 may be continuous to one side (e.g., an end in the –y axis direction) of the second valley V2. The third part P3 may be formed to have a specific inclination that is inclined in the y axis direction from the second part P2. A border area of the second part P2 and the third part P3 may be rounded at a second curvature R2. The second curvature R2 may be a value (e.g., the first curvature R1 is gentler than the second curvature R2) that is smaller than the first curvature R1. The third part P3 may have the third inclination angle as3 with respect to the –y axis. The third inclination angle as3 may include an acute angle that is smaller than 90 degrees in the –y axis direction from the y axis with respect to the x axis, and an absolute angle of the third inclination angle as3 may be larger than an absolute value of the second inclination angle as2. According to various embodiments, the absolute value of the third inclination angle as3 may be the same as or larger than the absolute value of the first inclination angle as1.

Referring to FIG. 20, the cam shape described in FIG. 19 may be applied to at least one cam or at least one cam structure (e.g., the fixed cam or the rotation cam) described above in FIGS. 4 to 18. For example, in the illustrated drawing, the protrusion of the cam 2400a may be disposed to protrude in the –x axis direction from the x axis, and the protrusion of a cam structure 2400b may be disposed to protrude in the x axis direction from the –x axis. Alternatively, the convexo-concave part of the cam 2400a and the convexo-concave part of the cam structure 2400b may be disposed to face each other. At least a portion of a second part 2400a_P2 of the cam 2400a and at least a portion of a second part 2400b_P2 of the cam structure 2400b, as illustrated, may contact each other in a free stop section (a section, in which the electronic device is held in a specific angle range due to the frictions of the cam 2400a and the cam structure 2400b) of the electronic device (e.g., the electronic device 100 of FIG. 1. According to an embodiment, when the electronic device is in the free stop state described in FIG. 16 or FIG. 17, the display (the display 160 of FIG. 1 or FIG. 2) may exert a repulsive force for restoring to the unfolded state (the state of FIG. 3).

According to an embodiment, the cam 2400a may be pushed in the y axis direction by a restoring force of the display (e.g., a repulsive force of the display is applied in the counterclockwise direction), and the cam structure 2400b may be pushed in the –y axis direction by a restoring force of the display (e.g., a repulsive force of the display is applied in the clockwise direction). In this process, because the second part 2400a_P2 of the cam 2400a and the second part 2400b_P2 of the cam structure 2400b contact each other while having the above-described second inclination angle as2, the cam 2400a and the cam structure 2400b of the disclosure may restrain pushing (e.g., a change in an angle between the first housing (e.g., the first housing 110 of FIG. 1 or FIG. 2) and the second housing (e.g., the second housing 120 of FIG. 1 or FIG. 2) of the display in the free stop state, which may occur regardless of an intention of the user) by at least partially offsetting the repulsive force (or the restoring force) that is generated in the unfolding direction of the display. According to various embodiments, as in FIG.

16 or FIG. 17 above, the electronic device may be in a holding state (or a free stop state) of a specific angle. In this state, the electronic device, as illustrated, may be disposed to be engaged with the cam 2400a and the cam structure 2400b, and the repulsive force or the restoring force of the display may offset a force applied in the unfolded state as in FIG. 3. The example structure of FIG. 20 illustrates all of the apex portions of the mountains of the cam 2400a and the cam structure 2400b have the second inclination angle as2, but the disclosure is not limited thereto. For example, the second part P2 having the second inclination angle as2 may be formed in only any one of the cam 2400a or the cam structure 2400b.

Meanwhile, the unfolding rotation direction has been described with respect to a direction, in which the cam 2400a is rotated in the y axis (or rightward) direction from the –y axis (or the left side) in FIG. 20, but the disclosure is not limited thereto. For example, according to a design layout of the electronic device, a direction, in which the cam 2400a is rotated in the –y axis direction from the y axis, may be a direction, in which the display is operated from the folded state to the unfolded state.

According to various embodiments, a hinge structure of an electronic device (or a portable electronic device, a foldable communication device, a foldable electronic device, or a foldable electronic device having a communication function) may include a first rotation part 211 connected to a first housing 110 and being rotatable about a first axis, a second rotation part 212 connected to a second housing 120 and being rotatable about a second axis in an opposite direction to that of the first rotation part, a first arm part 221 connected to the first rotation part and being rotatable about a first rotary shaft, a second arm part 222 connected to the second rotation part and being rotatable about a second rotary shaft in an opposite direction to that of the first arm part, a first fixing pin 251 connecting the first rotation part and the first arm part, and a second fixing pin 252 connecting the second rotation part and the second arm part. The first rotation part may include a first bracket body 2111, and a first sliding part 211_21 formed on one side of the first bracket body, and including a first slide hole 2112, into which a portion of the first fixing pin is inserted, the first arm part 221 may include a first basic body 2211, and a first connection part 221_2 formed on one side of the first basic body, and the first connection part may include a first connection hole 221_2a, into which a portion of the first fixing pin is inserted, and a first protrusion 221_2b formed at a peripheral portion of the first connection hole such that at least a portion thereof is located in the first slide hole to contact the first sliding part.

According to various example embodiments, at least a portion of the first protrusion and the first sliding part in the first slide hole may point-contact or line-contact each other.

According to various example embodiments, the first sliding part may include a first sliding/holding part, on which the first protrusion is seated, and a second sliding/holding part continuous to the first sliding/holding part and on which a portion of the first fixing part is seated.

According to various example embodiments, a distance between a bottom surface and an upper surface of the first sliding/holding part may be larger than a distance between a bottom surface and an upper surface of the second sliding/holding part.

According to various example embodiments, a bottom surface or an upper surface of the sliding/holding part may be formed to have an inclination angle that is larger than 0 degrees in a direction of the second sliding/holding part.

According to various example embodiments, the first connection part may include a female screw thread pattern formed on an inside of the first connection hole, and the first fixing pin may include a male screw thread pattern engaged with the female screw thread pattern.

According to various example embodiments, the male screw thread pattern may have a length that is larger than a length of the first connection hole.

According to various example embodiments, the hinge structure may further include a pin coupling part coupled to an end of the first fixing pin.

According to various example embodiments, the pin coupling part may include a nut configured to be coupled to the male screw thread pattern.

According to various example embodiments, the hinge structure may further include at least one of an elastic member or a washer ring disposed between the pin coupling part and the first connection part.

According to various example embodiments, the hinge structure may further include at least one of an elastic member or a washer ring disposed between the fixing pin and the first sliding part.

According to various example embodiments, the first connection part may include a first cylindrical connection part, in which a portion of the connection hole is formed at a center thereof, a second cylindrical connection part spaced apart from the first cylindrical connection part by a specific distance, and in which another portion of the connection hole is formed at the center thereof, and a holding groove disposed between the first cylindrical connection part and the second cylindrical connection part, the first fixing pin may include a cover, a column part extending from a central portion of the cover, and a band groove formed at one end of the column part, and the hinge structure may further include a modified elastic member, one side of which is inserted into the holding groove and in which the band groove is inserted into an opposite side thereof.

According to various example embodiments, the modified elastic member may include a support part, a holding part extending from one side of the support part in a direction of the holding groove, and a pin coupling part extending from an opposite side of the support part in a direction of the first connection part and coupled to the band groove.

According to various example embodiments, the first fixing pin may be movable in the first slide hole in correspondence of rotations of the first rotation part and the second rotation part and is moved while a movement path thereof forms a specific curvature.

According to various example embodiments, the first sliding part may be configured such that at least a portion of at least one of a hole inner bottom surface and a hole inner upper surface, which define the first slide hole, defines a curved surface in correspondence to the movement path.

According to various example embodiments, the second rotation part may include a second bracket body, and a second sliding part formed on one side of the second bracket body, and including a second slide hole, into which a portion of the second fixing pin is inserted, the second arm part may include a second basic body, and a second connection part formed on one side of the second basic body, and the second connection part may include a second connection hole, into which a portion of the second fixing pin is inserted, and a second protrusion formed at a peripheral portion of the second connection hole such that at least a portion thereof is located in the second slide hole to contact the second sliding part.

According to various example embodiments, at least a portion of the second protrusion and the second sliding part in the second slide hole may point-contact or line-contact each other.

According to various example embodiments, a thickness of the second protrusion may become gradually smaller as it goes farther away from a peripheral portion of the second connection hole.

According to various example embodiments, the second sliding part may include a third sliding/holding part, on which at least a portion of the second protrusion is seated, and at least a portion of which is curved in correspondence to a movement path of the second fixing pin, and a fourth sliding/holding part, on which at least a portion of the second fixing pin is seated, and at least a portion of which is curved in correspondence to the movement path of the second fixing pin.

According to various example embodiments, an electronic device may include a first housing, a second housing, at least one hinge structure connecting the first housing and the second housing, and a display, at least a portion of which is disposed on the first housing, the second housing, and the at least one hinge structure. The hinge structure may include a first rotation part connected to the first housing and being rotatable about a first axis, a second rotation part connected to the second housing and being rotatable about a second axis in an opposite direction to that of the first rotation part, a first arm part connected to the first rotation part and being rotatable about a first rotary shaft, a second arm part connected to the second rotation part and being rotatable about a second rotary shaft in an opposite direction to that of the first arm part, a first fixing pin connecting the first rotation part and the first arm part, and a second fixing pin connecting the second rotation part and the second arm part. The first rotation part may include a first bracket body, and a first sliding part formed on one side of the first bracket body, and including a first slide hole, into which a portion of the first fixing pin is inserted, the first arm part may include a first basic body, and a first connection part formed on one side of the first basic body, and the first connection part may include a first connection hole, into which a portion of the first fixing pin is inserted, and a first protrusion formed in a peripheral part of the first connection hole such that at least a portion thereof is located in the first slide hole to contact the first sliding part.

Each of the components (e.g., a module or a program) according to various embodiments may include a single or a plurality of entities, and some of the corresponding sub-components may be omitted or another sub-component may be further included in various embodiments. Alternatively or additionally, some components (e.g., a module or a program) may be integrated into one entity to perform functions performed by the corresponding components before the integration in the same way or similarly. The operations performed by a module, a program module, or another component according to various embodiments may be executed sequentially, in parallel, repeatedly, or heuristically, or at least some operations may be executed in another sequence or may be omitted, or another operation may be added.

While the disclosure has been illustrated and described with reference to various example embodiments, it will be understood that the various embodiments are intended to be illustrative, not limiting. It will be further understood by those skilled in the art that various changes in form and detail may be made without departing from the true spirit and full scope of the disclosure, including the appended claims and their equivalent. It will also be understood that any of the embodiment(s) described herein may be used in conjunction with any other embodiment(s) described herein.

What is claimed is:

1. A hinge structure comprising:
a first rotation part connected to a first housing and being rotatable about a first axis;
a second rotation part connected to a second housing and being rotatable about a second axis in an opposite direction to that of the first rotation part;
a first arm part connected to the first rotation part and being rotatable about a first rotary shaft;
a second arm part connected to the second rotation part and being rotatable about a second rotary shaft in an opposite direction to that of the first arm part;
a first fixing pin connecting the first rotation part and the first arm part; and
a second fixing pin connecting the second rotation part and the second arm part,
wherein the first rotation part includes:
a first bracket body; and
a first sliding part formed on one side of the first bracket body, and including a first slide hole, into which a portion of the first fixing pin is inserted,
wherein the first arm part includes:
a first basic body; and
a first connection part formed on one side of the first basic body, and
wherein the first connection part includes:
a first connection hole-, into which a portion of the first fixing pin is inserted; and
a first protrusion formed at a periphery of the first connection hole such that at least a portion thereof is located in the first slide hole to contact the first sliding part,
wherein the first protrusion is configured to surround the periphery of the first connection hole.

2. The hinge structure of claim 1, wherein at least a portion of the first protrusion and the first sliding part in the first slide hole point-contact or line-contact each other.

3. The hinge structure of claim 1, wherein the first sliding part includes:
a first sliding/holding part, on which the first protrusion is seated; and
a second sliding/holding part which is continuous to the first sliding/holding part and on which a portion of the first fixing pin is seated.

4. The hinge structure of claim 3, wherein a distance between a bottom surface and an upper surface of the first sliding/holding part is larger than a distance between a bottom surface and an upper surface of the second sliding/holding part.

5. The hinge structure of claim 3, wherein a bottom surface or an upper surface of the first sliding/holding part is formed to have an inclination angle that is larger than 0 degrees in a direction of the second sliding/holding part.

6. The hinge structure of claim 1, wherein the first connection part includes:
a female screw thread pattern formed on an inside of the first connection hole, and
wherein the first fixing pin includes:
a male screw thread pattern configured to engage with the female screw thread pattern.

7. The hinge structure of claim 6, wherein the male screw thread pattern has a length that is larger than a length of the first connection hole.

8. The hinge structure of claim 6, further comprising:
a pin coupling part coupled to an end of the first fixing pin.

9. The hinge structure of claim 8, wherein the pin coupling part includes:
a nut configured for coupling to the male screw thread pattern.

10. The hinge structure of claim 8, further comprising at least one of:
an elastic member or a washer ring disposed between the pin coupling part and the first connection part.

11. The hinge structure of claim 1, further comprising at least one of:
an elastic member or a washer ring disposed between the first fixing pin and the first sliding part.

12. The hinge structure of claim 1, wherein the first connection part includes:
a first cylindrical connection part, in which a portion of the first connection hole is formed at a center thereof;
a second cylindrical connection part spaced apart from the first cylindrical connection part by a specific distance, and in which another portion of the first connection hole is formed at the center thereof; and
a holding groove disposed between the first cylindrical connection part and the second cylindrical connection part,
wherein the first fixing pin includes:
a cover;
a column part extending from a central portion of the cover; and
a band groove formed at one end of the column part, and
wherein the hinge structure further comprises an elastic member, one side of which is insertable into the holding groove and in which the band groove is inserted into an opposite side thereof.

13. The hinge structure of claim 12, wherein the elastic member includes:
a support part;
a holding part extending from one side of the support part in a direction of the holding groove; and
a pin coupling part extending from an opposite side of the support part in a direction of the first connection part and coupled to the band groove.

14. The hinge structure of claim 1, wherein the first fixing pin is movable in the first slide hole in correspondence of rotations of the first rotation part and the second rotation part and is moved while a movement path thereof forms a specific curvature.

15. The hinge structure of claim 14, wherein the first sliding part is configured such that at least a portion of at least one of a hole inner bottom surface and a hole inner upper surface, which define the first slide hole, defines a curved surface in correspondence to the movement path.

16. The hinge structure of claim 1, wherein the second rotation part includes:
a second bracket body; and
a second sliding part formed on one side of the second bracket body, and including a second slide hole, into which a portion of the second fixing pin is insertable,
wherein the second arm part includes:
a second basic body; and
a second connection part formed on one side of the second basic body, and
wherein the second connection part includes:
a second connection hole, into a portion of the second fixing pin is insertable; and a second protrusion formed at a peripheral portion of the second connection hole such that at least a portion thereof is located in the second slide hole to contact the second sliding part.

17. The hinge structure of claim 16, wherein at least a portion of the second protrusion and the second sliding part in the second slide hole point-contact or line-contact each other.

18. The hinge structure of claim 16, wherein a thickness of the second protrusion becomes gradually smaller further from the peripheral portion of the second connection hole.

19. The hinge structure of claim 18, wherein the second sliding part includes:

a third sliding/holding part, on which at least a portion of the second protrusion is seated, and at least a portion of which is curved in correspondence to a movement path of the second fixing pin; and a fourth sliding/holding part, on which at least a portion of the second fixing pin is seated, and at least a portion of which is curved in correspondence to the movement path of the second fixing pin.

20. An electronic device comprising:

a first housing;

a second housing;

at least one hinge structure connecting the first housing and the second housing; and a display, at least a portion of which is disposed on the first housing, the second housing, and the at least one hinge structure, wherein the hinge structure includes:

a first rotation part connected to the first housing and being rotatable about a first axis;

a second rotation part connected to the second housing and being rotatable about a second axis in an opposite direction to that of the first rotation part;

a first arm part connected to the first rotation part and being rotatable about a first rotary shaft;

a second arm part connected to the second rotation part and being rotatable about a second rotary shaft in an opposite direction to that of the first arm part;

a first fixing pin connecting the first rotation part and the first arm part; and a second fixing pin connecting the second rotation part and the second arm part, wherein the first rotation part includes:

a first bracket body; and a first sliding part formed on one side of the first bracket body, and including a first slide hole, into which a portion of the first fixing pin is insertable, wherein the first arm part includes:

a first basic body; and a first connection part formed on one side of the first basic body, and wherein the first connection part includes:

a first connection hole, into which a portion of the first fixing pin is insertable; and a first protrusion formed in a periphery of the first connection hole such that at least a portion thereof is located in the first slide hole to contact the first sliding part, wherein the first protrusion is configured to surround the periphery of the first connection hole.

* * * * *